US012660386B2

(12) United States Patent
Lin et al.

(10) Patent No.: US 12,660,386 B2
(45) Date of Patent: Jun. 16, 2026

(54) LIGHT-EMITTING DIODE DEVICE WITH IMPROVED AIRTIGHTNESS, LUMINOUS, EFFICIENCY AND RELIABILITY

(71) Applicant: QUANZHOU SANAN SEMICONDUCTOR TECHNOLOGY CO., LTD, Fujian (CN)

(72) Inventors: Qiuxia Lin, Fujian (CN); Dacheng Li, Fujian (CN); Senpeng Huang, Fujian (CN); Changchin Yu, Fujian (CN); Chen-ke Hsu, Fujian (CN)

(73) Assignee: QUANZHOU SANAN SEMICONDUCTOR TECHNOLOGY CO., LTD., Fujian (CN)

( * ) Notice: Subject to any disclaimer, the term of this patent is extended or adjusted under 35 U.S.C. 154(b) by 512 days.

(21) Appl. No.: 18/109,128

(22) Filed: Feb. 13, 2023

(65) Prior Publication Data

US 2023/0207754 A1 Jun. 29, 2023

Related U.S. Application Data

(63) Continuation-in-part of application No. PCT/CN2021/071627, filed on Jan. 14, 2021.

(51) Int. Cl.
H10H 20/855 (2025.01)
H10H 20/01 (2025.01)

(52) U.S. Cl.
CPC .......... H10H 20/855 (2025.01); H10H 20/01 (2025.01); H10H 20/0363 (2025.01)

(58) Field of Classification Search
CPC ............. H10H 20/855; H10H 20/0363; H10H 20/8506; H10H 20/036; H10H 20/0362
(Continued)

(56) References Cited

U.S. PATENT DOCUMENTS

2012/0056217 A1* 3/2012 Jung ...................... H10H 20/85
257/89
2017/0263823 A1* 9/2017 Abe ................... H10H 20/8512
(Continued)

FOREIGN PATENT DOCUMENTS

| CN | 201804913 | 4/2011 |
| CN | 106784243 | 5/2017 |
| CN | 208904057 | 5/2019 |

OTHER PUBLICATIONS

Search Report issued to PCT application No. PCT/CN2021/071627 on Oct. 18, 2021.

*Primary Examiner* — Eliseo Ramos Feliciano
*Assistant Examiner* — Mikka Liu
(74) *Attorney, Agent, or Firm* — MUNCY, GEISSLER, OLDS & LOWE, P.C.

(57) ABSTRACT

A light-emitting diode (LED) device includes a substrate, an LED chip, a light-transmissive element, and a bonding layer. The substrate has a first surface and a second surface opposite to the first surface in a thickness direction. The first surface has a functional region. The LED chip is disposed on the functional region of the first surface of the substrate. The light-transmissive element is disposed on the first surface of the substrate, and covers the LED chip. The bonding layer connects the substrate with the light-transmissive element, and is disposed on the substrate outside the functional region. The LED device has a surrounding surface. Cross sections of the surrounding surface in the thickness direction are straight lines that extend in the thickness direction.

20 Claims, 26 Drawing Sheets

(58) Field of Classification Search
USPC .................................................. 257/98–100
See application file for complete search history.

(56) References Cited

U.S. PATENT DOCUMENTS

2018/0277723 A1*   9/2018   Hirano ............. H10H 20/01335
2022/0190208 A1*   6/2022   Miller ................. H10H 20/841

* cited by examiner

| Providing a wafer | ～S201 |

| Providing a plurality of light-emitting diode chips | ～S202 |

| Connecting a light-transmissive unit to the wafer | ～S203 |

| Forming a plurality of through holes | ～S204 |

| Forming a plurality of second bonding layers | ～S205 |

| Performing a second dicing process | ～S206 |

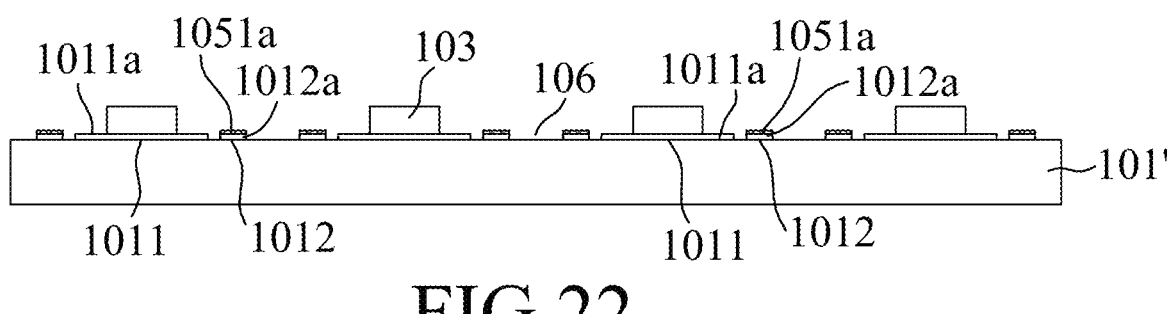
FIG.22
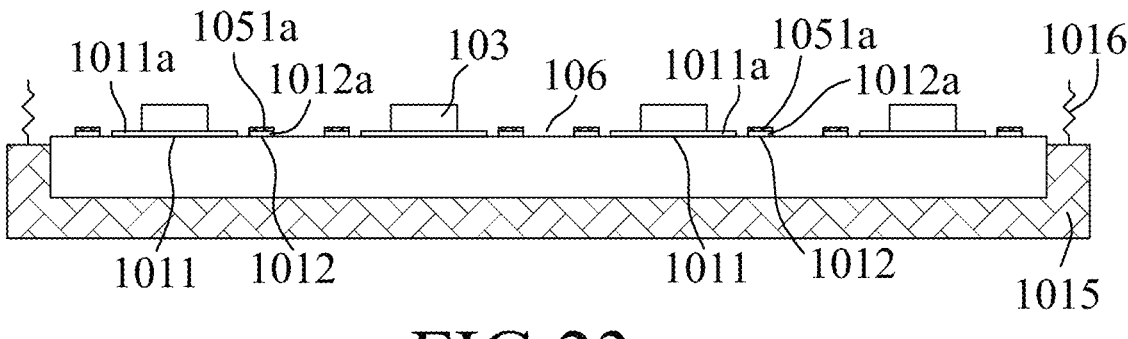
FIG.23
FIG.24

LIGHT-EMITTING DIODE DEVICE WITH IMPROVED AIRTIGHTNESS, LUMINOUS, EFFICIENCY AND RELIABILITY

CROSS-REFERENCE TO RELATED APPLICATION

This application is a bypass continuation-in-part (CIP) application of PCT International Application No. PCT/CN2021/071627 filed on Jan. 14, 2021. The entire content of the international patent application is incorporated herein by reference.

FIELD

The disclosure relates to a semiconductor device, and more particularly to a light-emitting diode (LED) device and a method for manufacturing the same.

BACKGROUND

Light-emitting diode (LED) chips are rapidly developing because of their excellent performance. In particular, ultra-violet LEDs (e.g., a deep ultraviolet LED) have attracted much attention and became a hot research topic for having significant application values, especially in the field of sterilization.

With an increasing demand for the deep ultraviolet LEDs, a structure of a deep ultraviolet LED becomes more diverse. Currently, a packaging process for manufacturing the deep ultraviolet LED is performed by connecting a quartz glass to a substrate through a binder. However, such packaging process has many problems. For example, since the substrate and the quartz glass are made of different materials, the binder may not effectively bind the quartz glass to the substrate, resulting in poor airtightness of the deep ultraviolet LED. In addition, when binding the quartz glass to the substrate, an amount of the binder being used may not be accurately controlled. If the amount of the binder is too small, the binder may not be able to fully fill a gap between the substrate and the quartz glass, which may adversely affect the airtightness of the deep ultraviolet LED. If the amount of the binder being used is too much, an excess of the binder may overflow to a functional region of the deep ultraviolet LED, which may adversely affect a luminous efficiency thereof. Because the quartz glass is relatively hard and brittle, the quartz glass may be easily broken during the manufacturing of the deep ultraviolet LED, thereby reducing the airtightness and reliability of the deep ultraviolet LED.

Therefore, there is a need to improve the airtightness, luminous efficiency, and reliability of the deep ultraviolet LED.

SUMMARY

Therefore, an object of the disclosure is to provide a light-emitting diode (LED) device that can alleviate at least one of the drawbacks of the prior art.

According to a first aspect of the disclosure, an LED device includes a substrate, an LED chip, a light-transmissive element, and a bonding layer.

The substrate has a first surface and a second surface opposite to the first surface in a thickness direction. The first surface has a functional region. The LED chip is disposed on the functional region of the first surface of the substrate. The light-transmissive element is disposed on the first surface of the substrate, and covers the LED chip. The bonding layer connects the substrate with the light-transmissive element, and is disposed on the substrate outside the functional region. The LED device has a surrounding surface. Cross sections of the surrounding surface in the thickness direction are straight lines that extend in the thickness direction.

According to a second aspect of the disclosure, a method for manufacturing a light-emitting diode (LED) device includes the steps of:

a) providing a wafer that has a first surface and a second surface opposite to the first surface, the first surface having a plurality of functional regions, the functional regions being separated from one another by dicing regions;

b) providing a plurality of LED chips on the functional regions of the wafer, respectively;

c) connecting a light-transmissive unit to the wafer through a plurality of first bonding layers so as to obtain a lighting workpiece, the first bonding layers being disposed on the wafer and being respectively located outside the functional regions, the light-transmissive unit covering the LED chips; and d) dicing the lighting workpiece along the dicing regions of the wafer, so as to form a plurality of LED devices.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIG. 20 is a flow chart illustrating consecutive steps of a method for manufacturing the variation of the second embodiment of FIG. 16.

FIGS. 21 to 33 are schematic views illustrating some intermediate stages of the method as depicted in FIG. 20.

DETAILED DESCRIPTION

Figure 1:
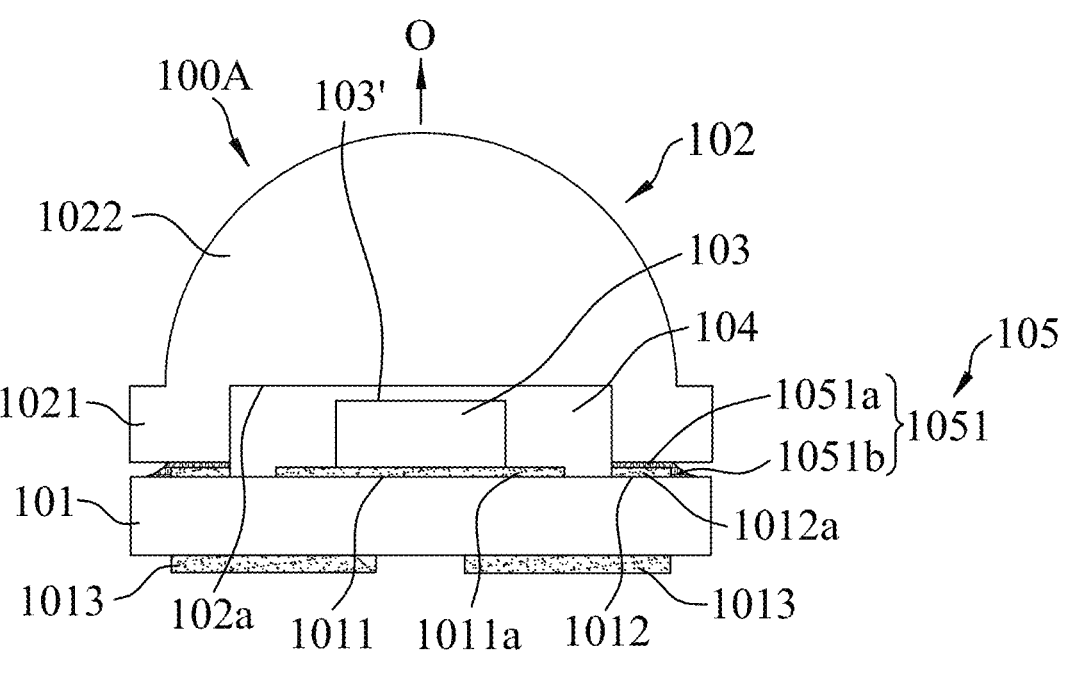
FIG. 1 is a schematic view illustrating a first embodiment of a light-emitting diode (LED) device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "on," "above," "over," "upwardly," and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, a first embodiment of a light-emitting diode (LED) device 100A according to the present disclosure includes a substrate 101, a first metal layer 1011a, a second metal layer 1012a, an LED chip 103, a light-transmissive element 102, a bonding layer 105, and a plurality of electrode pads 1013.

The substrate 101 may be a ceramic substrate, a printed circuit board, or other suitable substrates. In this embodiment, the substrate 101 is a flat ceramic substrate. The substrate 101 has a first surface and a second surface opposite to the first surface in a thickness direction (O) (indicated by an arrow shown in FIG. 1). The first surface of the substrate 101 has a functional region 1011 and a non-functional region 1012 that is located outside the functional region 1011. The electrode pads 1013 are disposed on the second surface of the substrate 101 and are connected to the functional region 1011. The functional region 1011 serves as a die bonding region on which the LED chip 103 is disposed. For example, the LED chip 103 may be connected to the functional region 1011 through gold wires or may be directly soldered to the functional region 1011. In certain embodiments, the first metal layer 1011a is formed on the functional region 1011 of the first surface of the substrate 101. The first metal layer 1011a has positive and negative electrode regions that are connected to an electrode structure of the LED chip 103, and the electrode pads 1013 are electrically connected to the positive and negative electrode regions of the first metal layer 1011a, respectively.

There is no particular limitation on the LED chip 103. For example, the LED chip 103 may be an ultraviolet LED chip or a deep ultraviolet LED chip that has an emission wavelength smaller than 400 nm, such as ranging from 220 nm to 385 m. In this embodiment, the LED chip 103 is the ultraviolet LED chip that has an emission wavelength ranging from 220 nm to 385 nm. The LED chip 103 may have a thickness ranging from 200 μm to 750 μm, such as from 250 μm to 500 μm or 450 μm. It is noted that the LED chip 103 may include a supporting substrate (not shown) and a semiconductor stack (not shown) formed on a surface of the supporting substrate. The semiconductor stack may include a first semiconductor layer, an active layer, and a second semiconductor layer that are sequentially formed on the surface of the supporting substrate. The electrode structure of the LED chip 103 may be connected to a respective one of the first and second semiconductor layers. The electrode structure of the LED chip 103 is connected to the functional region 1011 of the substrate 101 using methods such as soldering, eutectic bonding, or the like, so that the LED chip 103 may be fixed onto the substrate 101.

The supporting substrate of the LED chip 103 may be a sapphire substrate, and the first semiconductor layer of the semiconductor stack may be an N-type aluminum gallium nitride (AlGaN) layer. The LED chip 103 may further include an aluminum nitride (AlN) buffer layer and an AlN/AlGaN superlattice layer that are disposed between the first semiconductor layer (e.g., the N-type AlGaN layer) and the supporting substrate (e.g., the sapphire substrate), thereby reducing lattice mismatch between the first semiconductor layer and the supporting substrate. The active layer may be an AlGaN multi-quantum well layer, and is disposed on a side of the first semiconductor layer that is distal from the supporting substrate. The second semiconductor layer of the semiconductor stack may be a P-type AlGaN layer, and is disposed on a side of the active layer that is distal from the supporting substrate.

The light-transmissive element 102 includes a mounting base 1021 and a light-transmissive region 1022. The light-transmissive element 102 is connected to the substrate 101 through the bonding layer 105 that is disposed on the substrate 101 outside the functional region 1011 (i.e., disposed on the non-functional region 1012).

In this embodiment, the light-transmissive element 102 is made of quartz glass and has a lens structure. The light-transmissive region 1022 is a convex lens, and the mounting base 1021 is connected to and surrounds the light-transmissive region 1022. The mounting base 1021 is connected to the non-functional region 1012, and the light-transmissive region 1022 is located above the LED chip 103. In this embodiment, the LED device 100A may further include a cavity 104 defined by the mounting base 1021, the light-transmissive region 1022, and the substrate 101. The LED chip 103 is located in the cavity 104. The cavity 104 may have a depth ranging from 100 μm to 900 μm in the thickness direction (O). It is noted that the LED device 100A may further include a filler (not shown) in the cavity 104, such as a reflective layer and/or an encapsulant that may contain a phosphor powder. In order to enhance the luminous efficiency of the LED device 100A, a central line of the LED chip 103 overlaps a central line of the light-transmissive region 1022 (e.g., a convex lens) that passes through a geometry center of the light-transmissive region 1022. Each of the central lines of the LED chip 103 and the light-transmissive region 1022 extends in the thickness direction (O).

Figure 2:
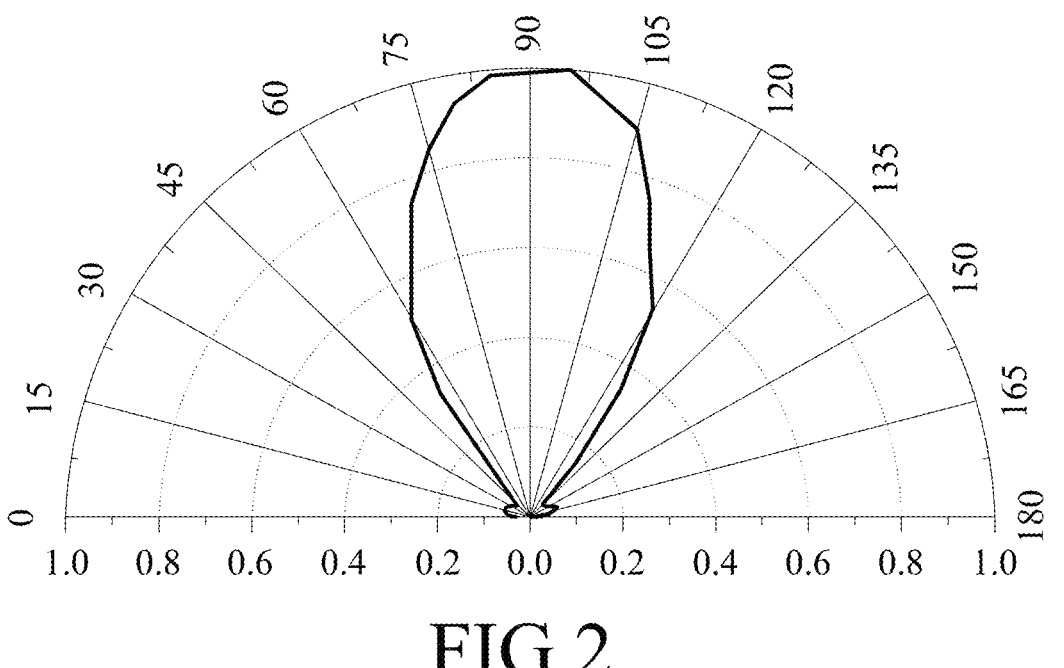
FIG. 2 is a schematic view illustrating a light exiting angle of the first embodiment of the LED device according to the disclosure.

In this embodiment, the light-transmissive region 1022 of the light-transmissive element 102 is a hemispherical convex lens. The geometry center of the light-transmissive region 1022 may be located at a position between a top surface 103' of the LED chip 103 and a bottom surface 102a of the light-transmissive region 1022. The light-transmissive region 1022 (i.e., the hemispherical convex lens) may have a spherical diameter ranging from 2.00 mm to 3.50 mm, such as 3.20 mm. The light-transmissive element 102 may have a height in the thickness direction (O) that ranges from 1.50 mm to 2.30 mm, such as 2.10 mm. As shown in FIG. 2, by having the light-transmissive element 102, the LED device 100A may have a light exiting angle of approximately 60°. The light exiting angle of the LED device 100A may be adjusted depending on the filler in the cavity 104 between the mounting base 1021 and the light-transmissive region 1022. For example, when the LED device 100A includes no filler in the cavity 104 (i.e., only air or nitrogen is present in the cavity 104), the light exiting angle of the LED device 100A may range from 55° to 80°. For another example, when the LED device 100A includes the filler in the cavity 104 (e.g., an inorganic gel or other reflective materials), the light exiting angle of the LED device 100A may range from 80° to 120°.

Referring to FIG. 1, the second metal layer 1012a is formed on the non-functional region 1012 of the substrate 101, and is formed as a metal strip that surrounds and is spaced apart from the functional region 1011. The first metal layer 1011a and the second metal layer 1012a may be made of the same or different metallic materials. When the first metal layer 1011a and the second metal layer 1012a are made of the same metallic material, the first metal layer 1011a and the second metal layer 1012a may be formed simultaneously. Each of the first metal layer 1011a and the second metal layer 1012a may have a thickness in the thickness direction (O) that ranges from 30 μm to 100 μm, such as 50 μm.

As shown in FIG. 1, the bonding layer 105 includes a first bonding layer 1051. The first bonding layer 1051 includes a first portion 1051a that is disposed on the second metal layer 1012a, and a second portion 1051b that is disposed on at least a part of the substrate 101 outside the second metal layer 1012a. It is noted that the second portion 1051b may be disposed on the substrate 101 at an outer side of the second metal layer 1012a away from the cavity 104, and may fill a space between the mounting base 1021 and the substrate 101.

The second metal layer 1012a increases a distance between a bottom surface of the mounting base 1021 and the first surface of the substrate 101 when the light-transmissive element 102 is connected to the substrate 101 through the first bonding layer 1051, and accordingly, a distance between the bottom surface 102a of the light-transmissive region 1022 and the top surface 103' of the LED chip 103, thereby preventing the LED chip 103 from being in move o with and damaged by the light-transmissive element 102. In addition, the distance between the bottom surface 102a of the light-transmissive region 1022 and the top surface 103' of the LED chip 103 may be adjusted by adjusting the thickness of the second metal layer 1012a. Such distance may be smaller than 100 μm, such as greater than 10 μm, so that the luminous efficiency of the LED chip 103 may be maintained under a premise that the LED chip 103 is not in contact with and damaged by the light-transmissive element 102.

There is no particular limitation on the material for forming the second metal layer 1012a as long as the second metal layer 1012a can be used to increase the distance between the bottom surface of the mounting base 1021 and the first surface of the substrate 101, and does not affect the photoelectric performance of the LED chip 103. The second metal layer 1012a may be made of, for example, but not limited to, a metal or an insulating material (e.g., silicon oxide or aluminum oxide that is formed by deposition).

In the thickness direction (O) of the LED device 100A, the first bonding layer 1051 may have a thickness ranging from 35 μm to 150 μm. The first portion 1051a of the first bonding layer 1051 may have a thickness ranging from 35 μm to 50 μm, and the second portion 1051b of the first bonding layer 1051 may have a thickness ranging from 50 μm to 150 μm.

The first bonding layer 1051 may be made of one of silica gel, white glue, and fluorine resin, which may have one or more properties, such as better adhesion, a certain flowability, or a certain reflective function for reflecting light emitted from the LED chip 103, thereby being able to increase the service life of the LED device 100A while improving the airtightness thereof.

In practice, a material of the light-transmissive element 102 may depend on the light exiting angle of the LED device 100A. In this embodiment, the light-transmissive element 102 is a lens made of quartz glass. In other embodiments, the light-transmissive element 102 may be a lens made of a plastic material.

As shown in FIG. 1, in this embodiment, the substrate 101 has a sidewall that is aligned with a sidewall of the light-transmissive element 102 in the thickness direction (O), which is conducive for the LED device 100A to be placed in a better location in a vibrator bowl feeder, and further enhancing a packaging yield of the LED device 100A. By virtue of the first portion 1051a of the first bonding layer 1051 uniformly and fully filling a space between the second metal layer 1012a and the light-transmissive element 102, there is no bubble or gap present therebetween, which is conducive for significantly enhancing the airtightness of the LED device 100A. In addition, the second portion 1051b of the first bonding layer 1051 that is formed on the part of the substrate 101 at the outer side of the second metal layer 1012a may further prevent water vapor from entering an interior of the LED device 100A. In particular, when the second portion 1051b of the first bonding layer 1051 fills a space between the substrate 101 and the light-transmissive element 102, the airtightness of the LED device 100A can be further enhanced.

Figures 3, 4:
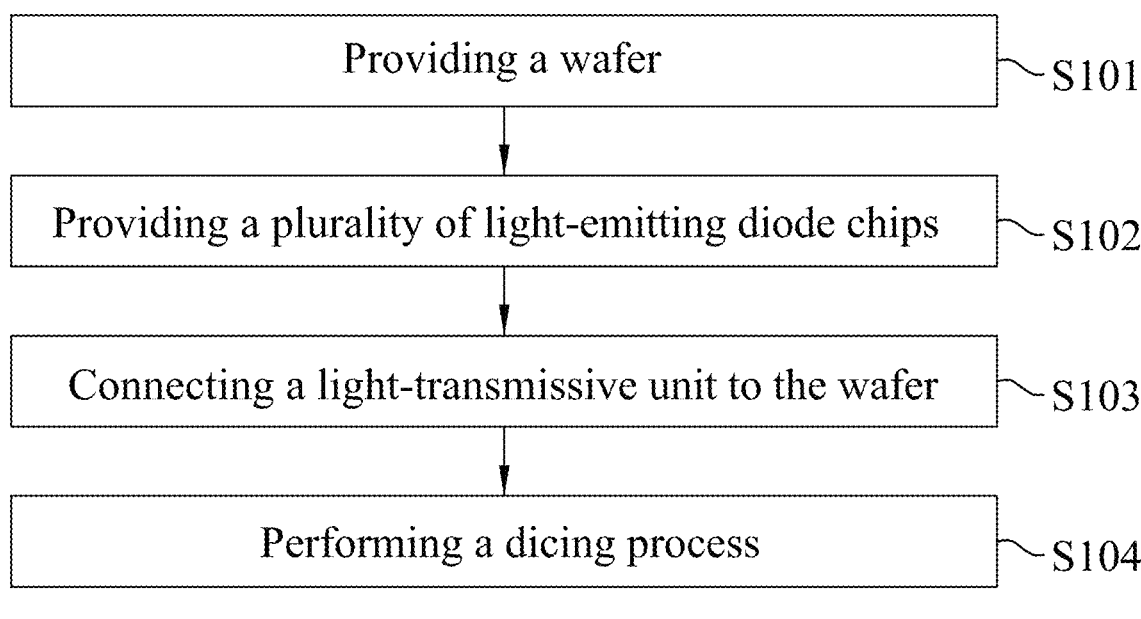
FIG. 3 is a flow chart illustrating consecutive steps of a method for manufacturing the first embodiment of the LED device.
FIGS. 4 to 14 are schematic views illustrating some intermediate stages of the method as depicted in FIG. 3.

Referring to FIG. 3, this disclosure also provides a method for manufacturing the first embodiment of the LED device 100A according to the present disclosure, which includes the following consecutive steps S101 to S104. FIGS. 4 to 14 illustrate intermediate stages of the method for manufacturing the first embodiment of the LED device 100A.

In step S101, a wafer 101' is provided. The wafer 101' has a first surface (corresponding to the first surface of the substrate 101) and a second surface (corresponding to the second surface of the substrate 101) opposite to the first surface. The first surface of the wafer 101' has a plurality of the functional regions 1011 and a plurality of dicing regions 1018. The functional regions 1011 are separated from one another by the dicing regions 1018.

Figure 5:
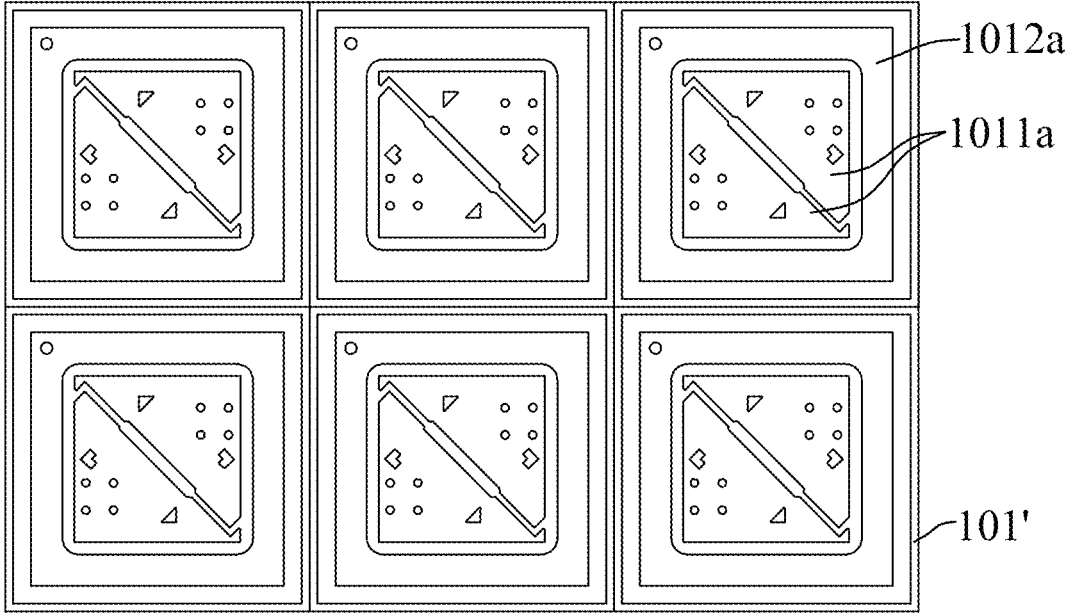

As shown in FIGS. 4 and 5, the first surface of the wafer 101' further includes a plurality of the non-functional regions 1012 that are located in the dicing regions 1018, and the electrode pads 1013 (not shown) are disposed on the second surface of the wafer 101' and are connected to the functional regions 1011, respectively.

In certain embodiments, in this step, a plurality of the first metal layers 1011a and a plurality of the second metal layers 1012a are formed on the first surface of the wafer 101'. A top surface of each of the first metal layers 1011a and the second metal layers 1012a is located at a level higher than that of the first surface of the wafer 101'. The first metal layers 1011a are formed on the functional regions 1011, respectively, and the second metal layers 1012a are formed as metal strips on the non-functional regions 1012, respectively. Each of the second metal layers 1012a surrounds and is spaced apart from a corresponding one of the functional regions 1011. Two adjacent ones of the second metal layers 1012a define a trench 106 that is located in a respective one of the dicing regions 1018.

In step S102, a plurality of the LED chips 103 are provided. The LED chips 103 are disposed on the functional regions 1011 of the first surface of the wafer 101', respectively, and are also disposed on the first metal layers 1011a, respectively.

Figure 6:
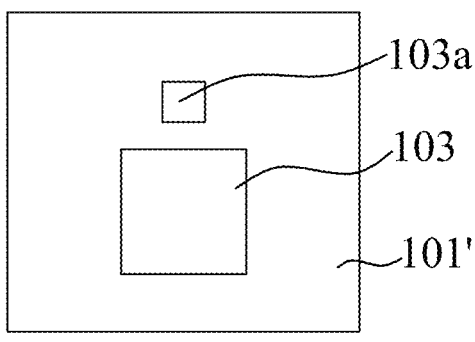
Figure 7:
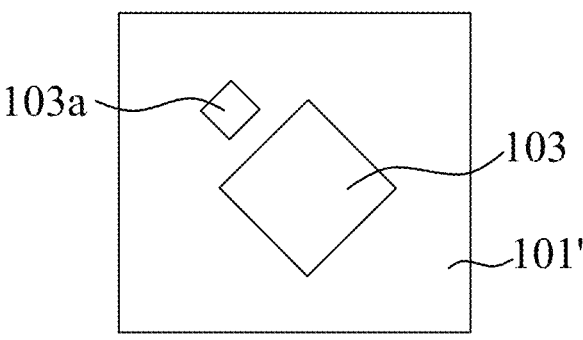

In certain embodiments, the LED chips 103 may be disposed on the wafer 101' in various ways. For example, as shown in FIG. 6, each of the LED chips 103 and the wafer 101' has a square shape, and sides of each of the LED chips 103 are aligned with sides of the wafer 101', respectively. For another example, as shown in FIG. 7, each of the LED chips 103 and the wafer 101' has a square shape, and each of the LED chips 103 is disposed on the wafer 101' in such a manner that four corners of each of the LED chips 103 point toward the four sides of the wafer 101', respectively. In certain embodiments, when the LED chip 103 has a relatively large size, the LED chip 103 may be disposed on the wafer 101' in a manner shown in FIG. 7, which is capable of increasing space utilization of the wafer 101'. In practice, the way that the LED chips 103 are disposed on the wafer 101' may be adjusted depending on the sizes of the LED chips 103 and the wafer 101'. In certain embodiments, a zener diode 103a may be disposed on the wafer 101' (see FIGS. 6 and 7).

In step S103, as shown in FIGS. 8 to 13, a light-transmissive unit 1020 is connected to the wafer 101' through a plurality of the first bonding layers 1051, and covers the LED chips 103, so as to obtain a lighting workpiece. The first bonding layers 1051 are disposed on the wafer 101', and are respectively located outside the functional regions 1011 (i.e., the dicing regions 1018).

Figure 8:
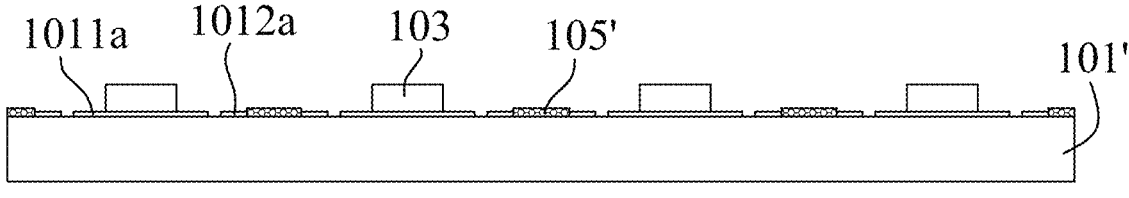

As shown in FIG. 8, a binder material 105' fills the trenches 106 (see FIG. 4). In certain embodiments, the binder material 105' that fills the trenches 106 may have a height that measures from the first surface of the wafer 101' and that is greater than that of each of the first metal layers 1011a on the functional regions 1011 and the second metal layers 1012a on the non-functional regions 1012. In certain embodiments, the height of the binder material 105' may be greater than that of each of the first metal layers 1011a and the second metal layers 1012a measured from the first surface of the wafer 101' by a difference ranging from 50 µm to 200 µm. The binder material 105' may be made of one of silica gel, white glue, and fluorine resin. In this embodiment, the light-transmissive unit 1020 is made of quartz glass and covers the wafer 101'. In addition, the light-transmissive unit 1020 includes a plurality of the light-transmissive elements 102, each of which has a lens structure shown in FIG. 1.

Figure 9:
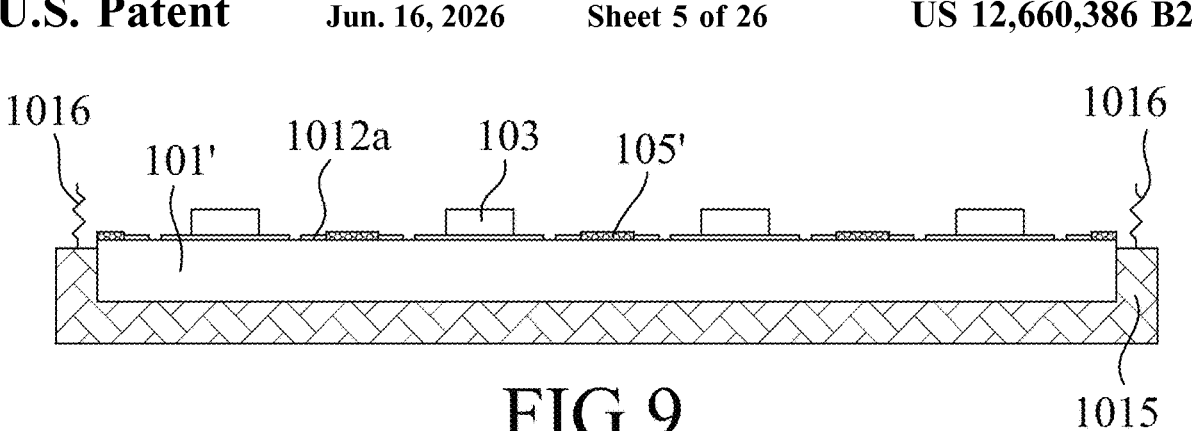

As shown in FIG. 9, the structure shown in FIG. 8 is fixedly placed in an accommodating space (not shown) of a first fixture 1015. The first fixture 1015 includes a first positioning element 1016 on a top portion of a sidewall of the first fixture 1015. In this embodiment, the first positioning element 1016 is a positioning spring, and the first fixture 1015 has at least two of the first positioning elements 1016. The number of the first positioning element 1016 may vary depending on actual requirements. It is noted that there is no particular limitation on the first positioning element 1016 as long as it can perform its intended function.

Figure 10:
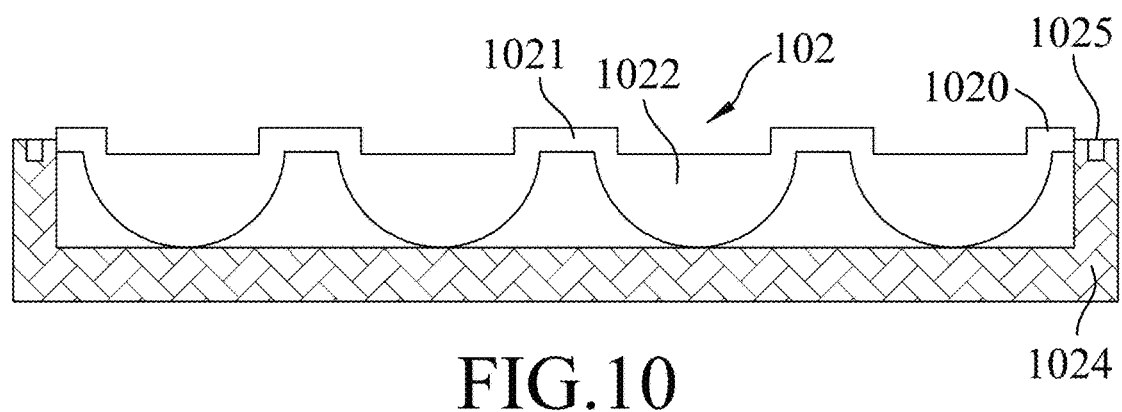

As shown in FIG. 10, the light-transmissive unit 1020 is placed in an accommodating space (not shown) of a second fixture 1024 that includes a bottom part and a side part connected to the bottom part, and the accommodating space of the second fixture 1024 is defined by a side surface of the side part and an upper surface of the bottom part. In order to accommodate and fixedly place the light-transmissive unit 1020 in the second fixture 1024, a pyrotic adhesive film (not shown) may be adhered to the side surface of the side part and the upper surface of the bottom part, and the light-transmissive unit 1020 is then disposed on the pyrotic adhesive film, so as to fix the light-transmissive unit 1020 in the second fixture 1024. The second fixture 1024 may have a second positioning element 1025 that is located on a top portion of the side part and that may cooperate with the first positioning element 1016 of the first fixture 1015, so that the second fixture 1024 might be in a positional correspondence with the first fixture 1015. In certain embodiments, when the first positioning element 1016 of the first fixture 1015 is the positioning spring, the second positioning element 1025 of the second fixture 1024 may be a positioning hole. In alternative embodiments, the first positioning element 1016 of the first fixture 1015 may be the positioning hole, and the second positioning element 1025 of the second fixture 1024 may be the positioning spring.

Figure 11:
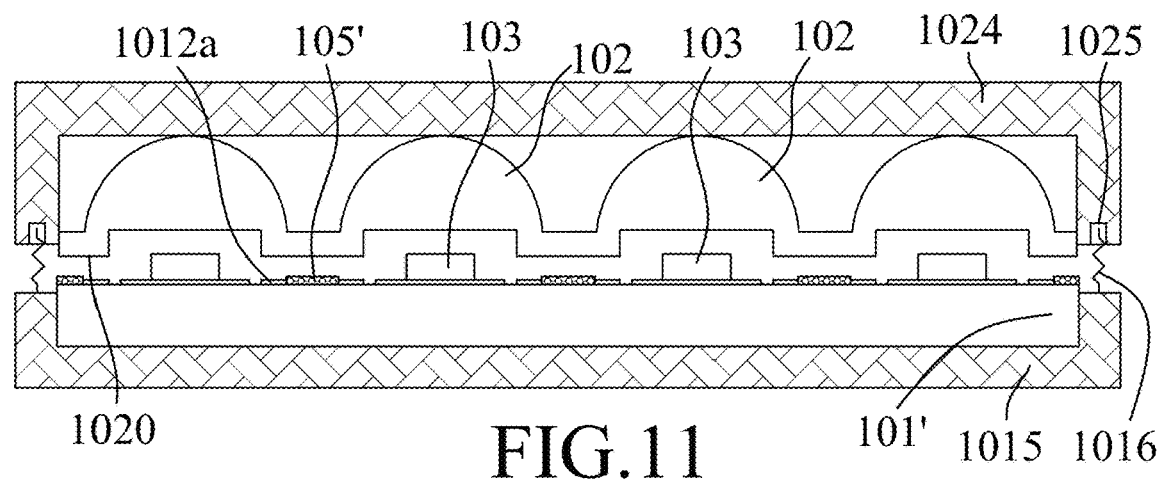

As shown in FIG. 11, the second fixture 1024 is turned over, so that the light-transmissive unit 1020 faces the wafer 101', and the first fixture 1015 and the second fixture 1024 are aligned and make contact with each other through the first positioning element 1016 and the second positioning element 1025. In such case, the light-transmissive elements 102 are aligned with the LED chips 103 disposed on the wafer 101', respectively. In certain embodiments, a central line of each of the light-transmissive elements 102 that passes through a geometry center of each of the light-transmissive elements 102 and that extends in the thickness direction (O) overlaps the central line of a corresponding one of the LED chips 103. FIG. 11 also illustrates that the first positioning element 1016 and the second positioning element 1025 are in contact with each other, but the light-transmissive unit 1020 is not in contact with the wafer 101'.

Figure 12:
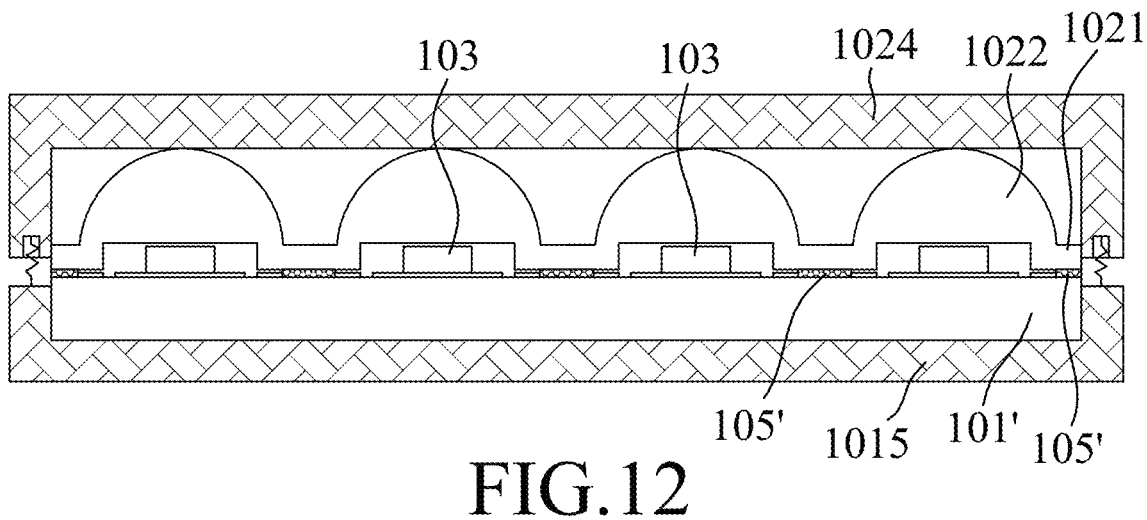

Afterwards, as shown in FIG. 12, the first fixture 1015 and the second fixture 1024 are placed in a vacuum laminating equipment (not shown). The mounting base 1021 of each of the light-transmissive elements 102 is in contact with the binder material 105' disposed on the wafer 101', and each of the LED chips 103 is accommodated in a corresponding one of the cavities 104 (see FIG. 1), so as to avoid each of the LED chips 103 being in contact with or damaged by a corresponding one of the light-transmissive regions 1022, and to maintain the performance of the LED chips 103. During the processes of laminating and vacuuming, since the height of the binder material 105' that fills a correspond-ing one of the trenches 106 (see FIG. 4) is higher than that of the second metal layers 1012a, the binder material 105' may be squeezed and a portion thereof may move onto the adjacent second metal layers 1012a (see FIG. 13).

Figure 13:
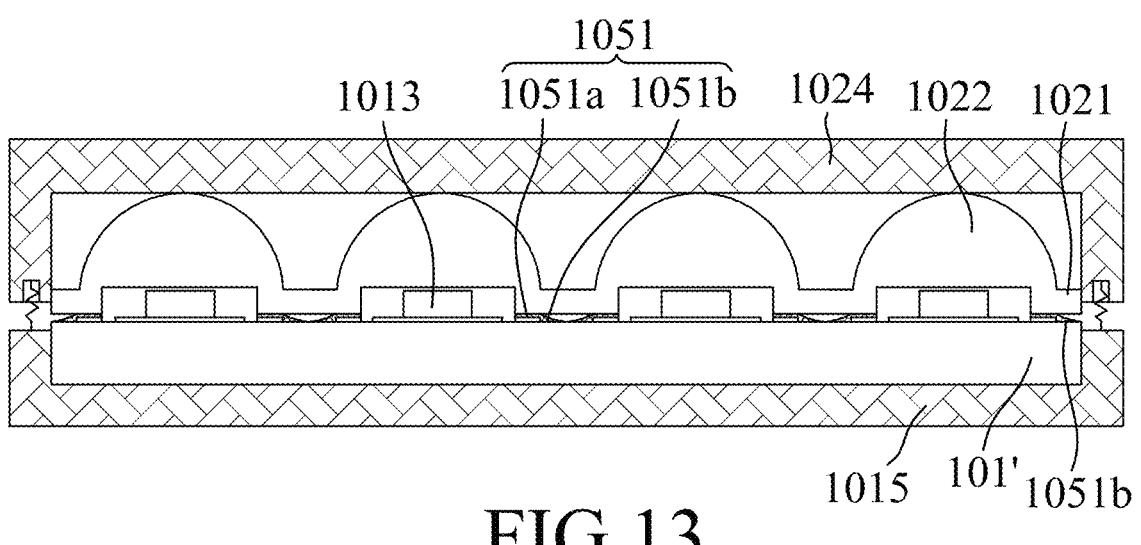

As shown in FIG. 13, an amount of the binder material 105' that fills the trenches 16 becomes less because the portion of the binder material 105' moves onto the adjacent second metal layers 1012a. During the vacuuming process, the binder material 105' may continue to move onto and cover the adjacent second metal layers 1012a, so as to form the first portions 1051a of the first bonding layers 1051, so that the light-transmissive unit 1020 can be tightly con-nected to the wafer 101' through the first portions 1051a of the first bonding layers 1051. The remaining portion of the binder material 105' in the trenches 16 is formed into the second portions 1051b of the first bonding layers 1051. Each of the second portions 1051b and a corresponding one of the first portions 1051a may corporately form a continuous structure, which may further enhance a bonding force between the light-transmissive unit 1020 and the wafer 101', and improve the airtightness of the LED device 100A. During the processes of laminating and vacuuming, the binder material 105' may be baked, which may facilitate flowing of the binder material 105' and the subsequent curing thereof. When the binder material 105' is baked, the pyrotic adhesive film that is adhered to the side surface of the side part of the second fixture 1024 and the upper surface of the bottom part of the second fixture 1024 may be decomposed, and an adhesive property of the pyrotic adhe-sive film may be adversely affected, which then enables the light-transmissive unit 1020 to be separated from the second fixture 1024.

In this embodiment, the portion of the binder material 105' in the trenches 16 moves onto the adjacent second metal layers 1012a, and the remaining portion of the binder material 105' becomes less and does not completely fill the trenches 16. In alternative embodiments, by adjusting the amount of the binder material 105', the binder material 105' may uniformly cover the adjacent second metal layers 1012a, and completely fill the trenches 16 after the processes of laminating and vacuuming, which may further enhance the airtightness of the LED device 100A.

Figures 14, 15:
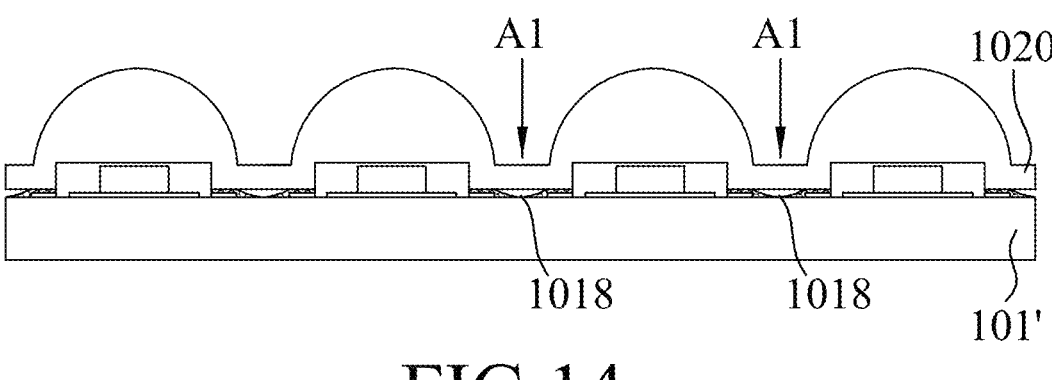
FIG. 15 is a schematic view illustrating a second embodiment of the LED device according to the disclosure.

Afterwards, as shown in FIG. 14, the first fixture 1015 and the second fixture 1024 are removed. For example, first, the vacuuming process is stopped. At this time the second fixture 1024 may be separated from the first fixture 1015 by a restoring force of the first positioning element 1016 (e.g., the positioning spring), thereby obtaining a structure shown in FIG. 14. In this embodiment, the portion of the binder material 105' in the trenches 16 moves onto the adjacent second metal layers 1012a on the non-functional regions

1012 without moving to the functional regions 1011, thereby preventing the functional regions 1011 from being polluted.

Therefore, the light-transmissive region 1022 of each of the light-transmissive elements 102 of the light-transmissive unit 1020 is aligned with a corresponding one of the LED chips 103, so as to ensure that a shortest distance between the central line of the light-transmissive region 1022 of each of the light-transmissive elements 102 and the central line of a corresponding one of the LED chips 103 is smaller than 100 μm, and the difference of the light exiting angle of light emitted from each of the LED chips 103 and passing through a geometry center of a corresponding one of the light-transmissive regions 1022 is smaller than ±3° in a direction perpendicular to the thickness direction (O). In certain embodiments, a distance between a geometry center of each of the light-transmissive elements 102 and a geometry center of a corresponding one of the LED chips 103 is smaller than 100 μm.

In step S104, a dicing process is performed on the dicing regions 1018 of the lighting workpiece in a direction indi-cated by arrows A1 shown in FIG. 14, so as to obtain the LED devices 100A (see FIG. 1).

After step S104, each of the LED devices 100A has a surrounding surface and cross sections of the surrounding surface are straight lines that extend in the thickness direc-tion (O). In addition, in a direction perpendicular to the thickness direction (O), the light-transmissive element 102 and the substrate 101 of each of the LED devices 100A have the same width, and in the thickness direction (O), the sidewall of the light-transmissive element 102 of each of the LED devices 100A is aligned with that of the substrate 101 of each of the LED devices 100A. As such, with the abovementioned structure, each of the LED devices 100A may be placed in a better location in the vibrator bowl feeder, and the packaging yield of the LED devices 100A may be further enhanced.

Referring to FIG. 15, a second embodiment of an LED device 100B according to the present disclosure is generally similar to the first embodiment, except that, in the second embodiment, the second metal layer 1012a is not formed on the non-functional region 1012, and the bonding layer 105 further includes a second bonding layer 1052 disposed on a sidewall of each of the first bonding layer 1051 and the mounting base 1021. In this embodiment, the first bonding layer 1051 is disposed between the non-functional region 1012 and the mounting base 1021.

In certain embodiments, the first bonding layer 1051 and the second bonding layer 1052 corporately form a continu-ous structure having an L shape. In the thickness direction (O), the first bonding layer 1051 may have a thickness (t1) ranging from 50 μm to 150 μm, and the second bonding layer 1052 may have a thickness (t2) ranging from 200 μm to 400 μm.

Figure 16:
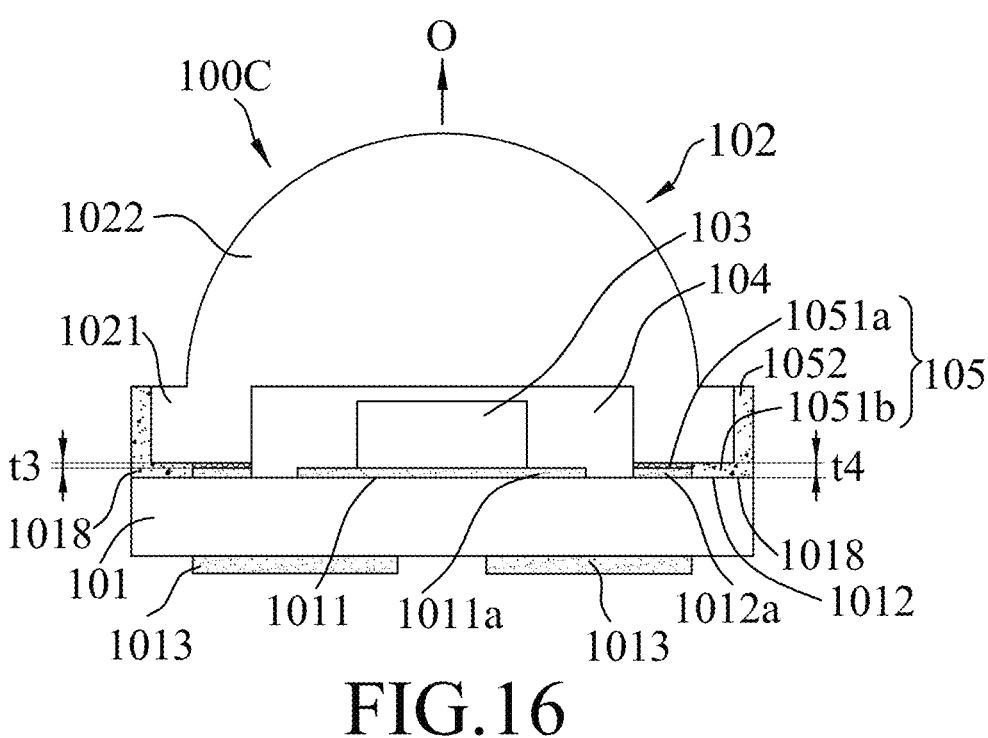
FIG. 16 is a schematic view illustrating a variation of the second embodiment.

In a variation of the second embodiment, as shown in FIG. 16, an LED device 100C further includes the second metal layer 1012a formed on the non-functional region 1012 of the substrate 101, and the first bonding layer 1051 includes the first portion 1051a that is disposed on the second metal layer 1012a and the second portion 1051b that is disposed on the non-functional region 1012 and between the first portion 1051a and the second bonding layer 1052. In the thickness direction (O), the first portion 1051a of the first bonding layer 1051 may have a thickness (t3) ranging from 35 μm to 50 μm, and the second portion 1051b of the first bonding layer 1051 may have a thickness (t4) ranging from 50 μm to 150 μm. In this variation, the second portion 1051b of the first bonding layer 1051 and the second bonding layer 1052 corporately form a continuous structure having an L shape.

In FIGS. 15 and 16, by virtue of the continuous structure covering the non-functional region 1012 and the sidewall of the mounting base 1021, and by virtue of the first bonding layer 1051 being disposed between the mounting base 1021 and the substrate 101, no bubble or gap exists in the LED devices 100B, 100C, which may significantly improve the airtightness and reliability of the LED devices 100B, 100C. In addition, the first bonding layer 1051 and the second bonding layer 1052 may be made of the same or different materials, such as silica gel, white glue, fluorine resin, etc. The material for forming the first bonding layer 1051 or the second bonding layer 1052 may have one or more properties, such as a better adhesion, a certain flowability and a certain reflective function for reflecting light emitted from the LED chip 103, which may improve the airtightness of the LED devices 100B, 100C and extend the service life of the LED devices 100B, 100C.

As shown in FIGS. 15 and 16, the sidewall of the second bonding layer 1052 of each of the LED devices 100B, 100C is aligned with that of the substrate 101, which is conducive for each of the LED devices 100B, 100C to be placed in a better location in the vibrator bowl feeder, and further enhancing a packaging yield of each of the LED devices 100B, 100C.

Figure 17:
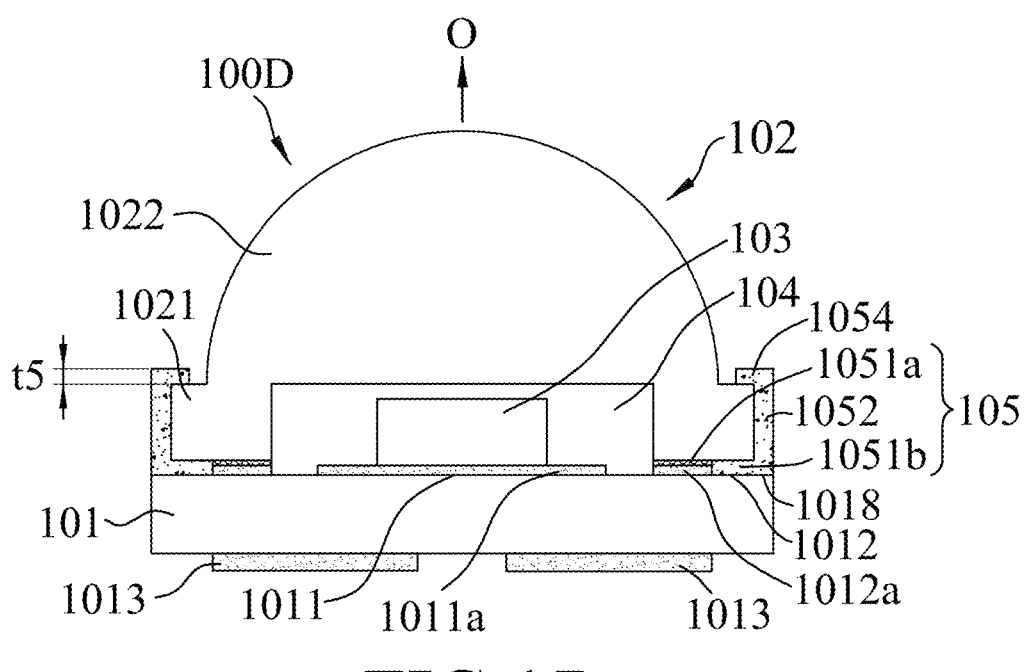
FIG. 17 is a schematic view illustrating another variation of the second embodiment.

In certain embodiments, as shown in FIG. 17, the bonding layer 105 of an LED device 100D further includes a fourth bonding layer 1054 formed on a part of an upper surface of the light-transmissive element 102. Specifically, the fourth bonding layer 1054 is formed on at least a part of an upper surface of the mounting base 1021 of the light-transmissive element 102. It is noted that the fourth bonding layer 1054 may be formed on the entire upper surface of the mounting base 1021. The fourth bonding layer 1054 and the second bonding layer 1052 may corporately form a continuous structure. That is to say, the second bonding layer 1052 and the fourth bonding layer 1054 may be formed simultaneously. In the thickness direction (O), the fourth bonding layer 1054 may have a thickness (t5) ranging from 10 μm to 200 μm. By virtue of the bonding layer 105 covering the mounting base 1021 of the light-transmissive element 102, the airtightness of the LED device 100D may be enhanced and the connection between the light-transmissive element 102 and the substrate 101 may be increased simultaneously.

Figure 18:
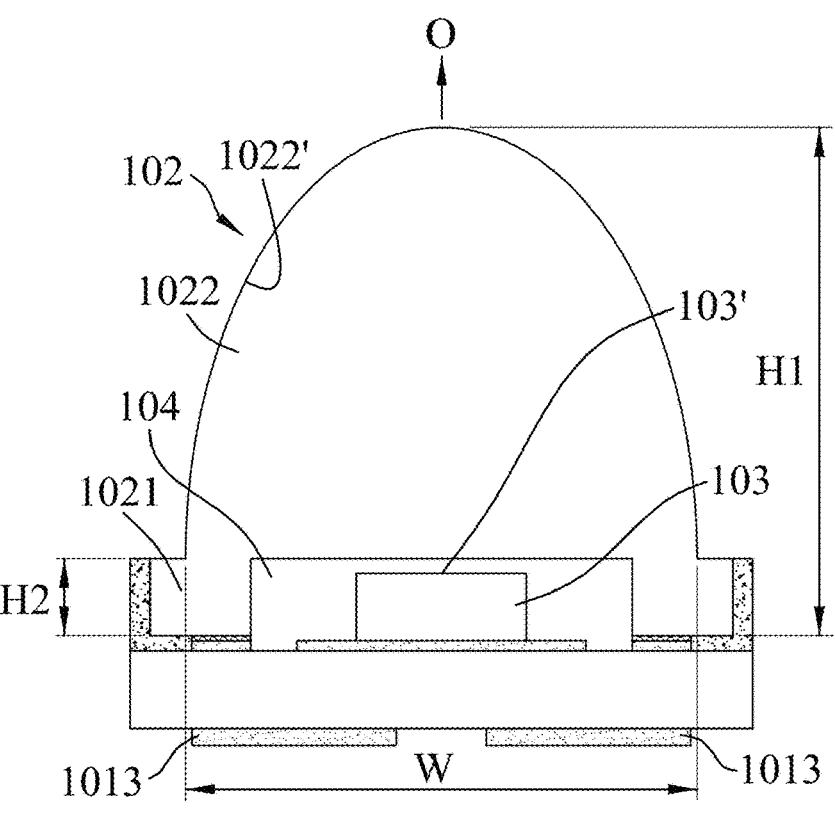
FIG. 18 is a schematic view illustrating another variation of the second embodiment.
Figure 19:
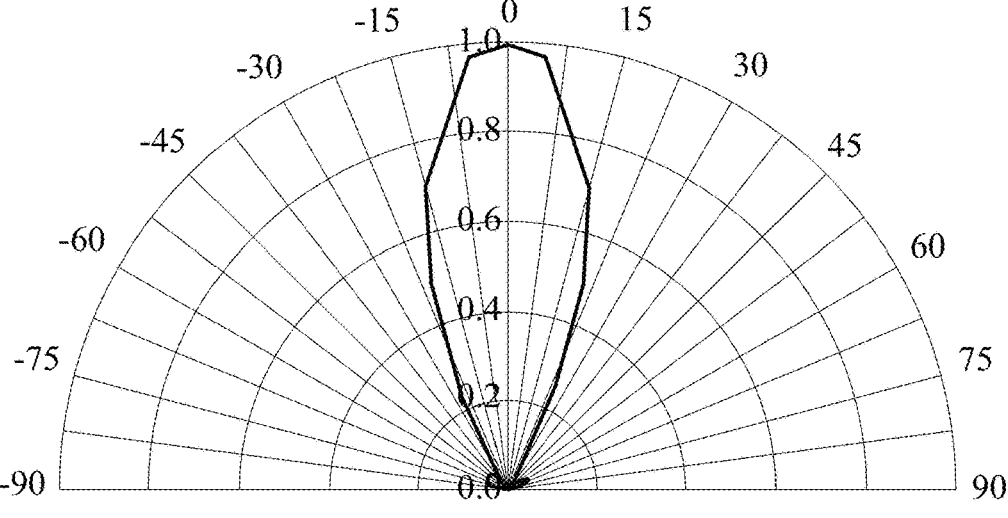
FIG. 19 is a schematic view illustrating a light exiting angle of the LED device of FIG. 18.

In certain embodiments, as shown in FIG. 18, the light-transmissive region 1022 of the light-transmissive element 102 is a hemi-ellipsoid convex lens having a long axis in the thickness direction (O), and the geometry center of the light-transmissive region 1022 is located at a position between the top surface 103' of the LED chip 103 and an inner surface 1022' of the light-transmissive region 1022. The light-transmissive element 102 may have a height (H1) in the thickness direction (O) (i.e., a vertical distance between a topmost point of the light-transmissive element 102 and a bottommost point of the light-transmissive element 102) ranging from 3.00 mm to 3.50 mm, the mounting base 1021 may have a height (H2) in the thickness direction (O) (i.e., a vertical distance between a topmost point of the mounting base 1021 and a bottommost point of the mounting base 1021) ranging from 0.3 m to 0.7 mm, and the light-transmissive element 102 may have a width (W) ranging from 2.00 mm to 3.50 mm (e.g., from 3.00 nm to 3.50 nm). As shown in FIG. 19, the LED device shown in FIG. 18 has a light exiting angle of approximately 35°. The light exiting angle of the LED device shown in FIG. 18 may be adjusted by adjusting the amount of the filler in the cavity

104. For example, when the LED device shown in FIG. 18 includes no filler in the cavity 104 (i.e., only air or nitrogen is present in the cavity 104), the light exiting angle of the LED device shown in FIG. 18 may range from 25° to 55°. For another example, when the LED device shown in FIG. 18 includes the filler in the cavity 104 (e.g., an inorganic gel or other reflective materials), the light exiting angle of the LED device shown in FIG. 18 may range from 55° to 75°.

Figures 20, 21:
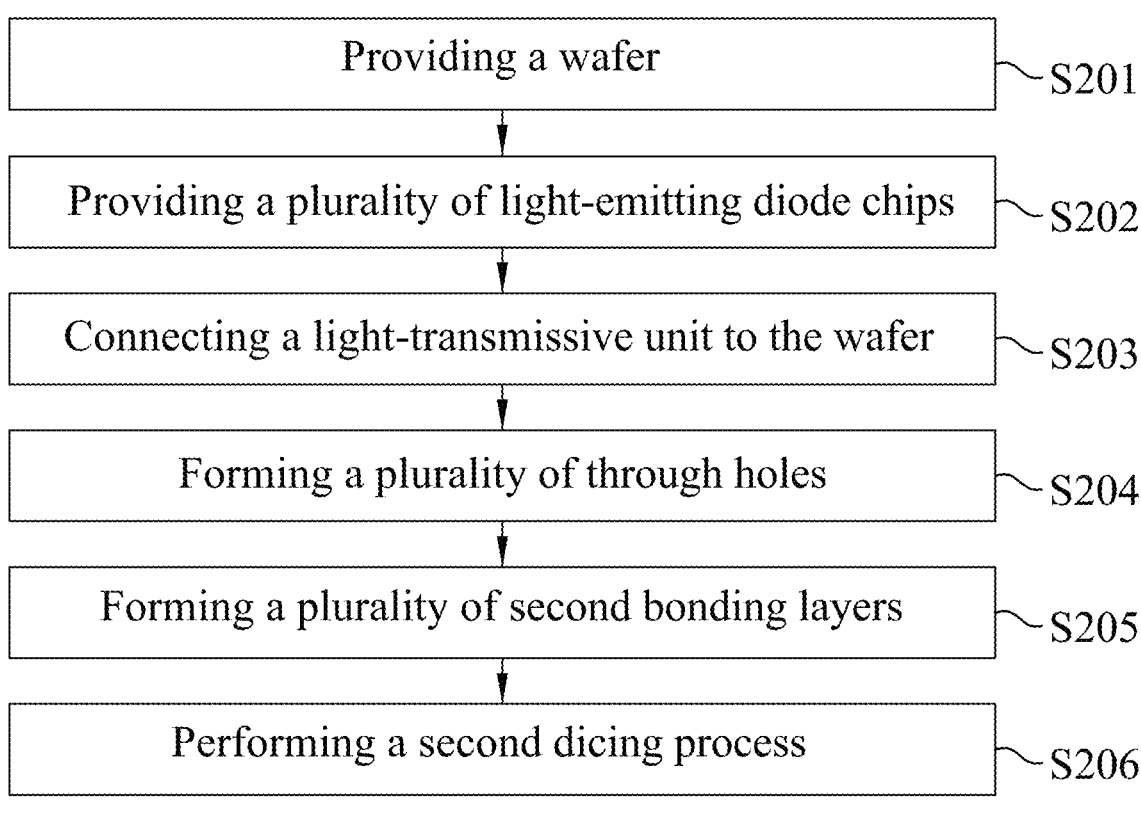
Figure 25:
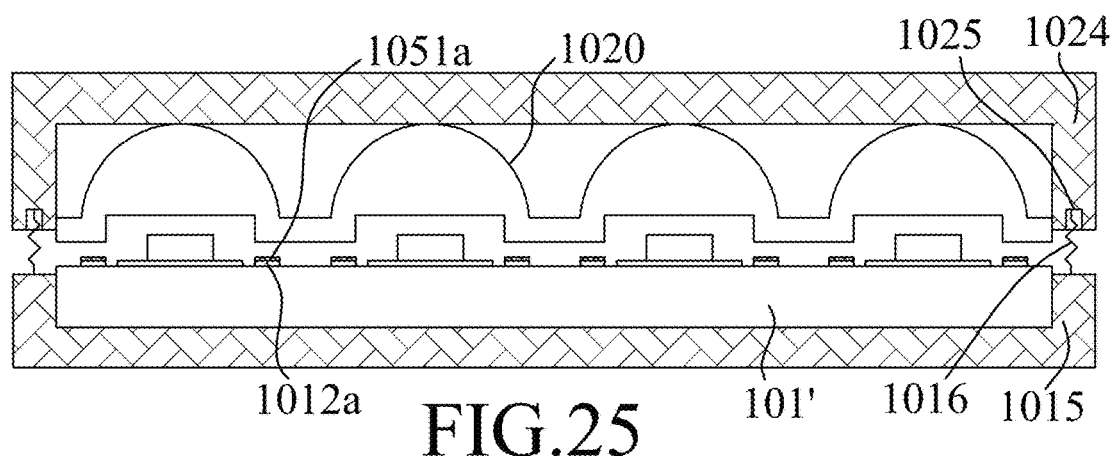
Figure 26:
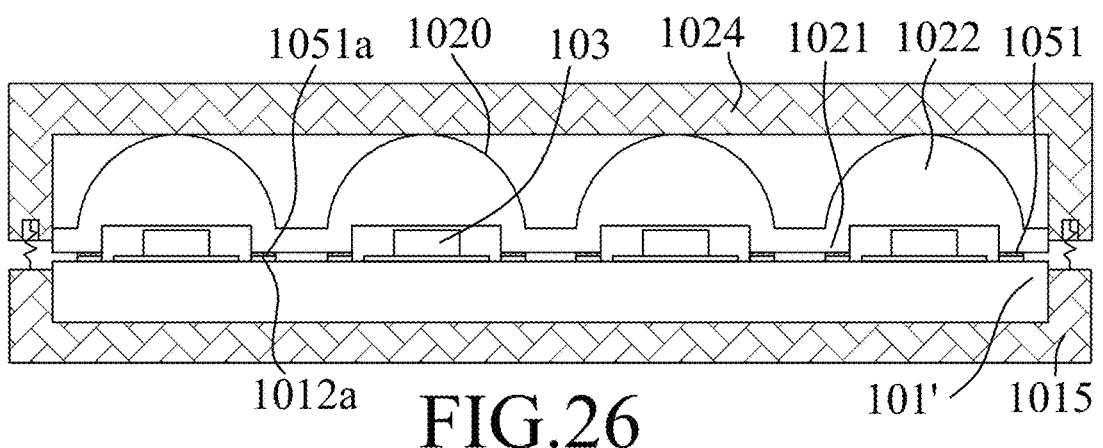
Figure 27:
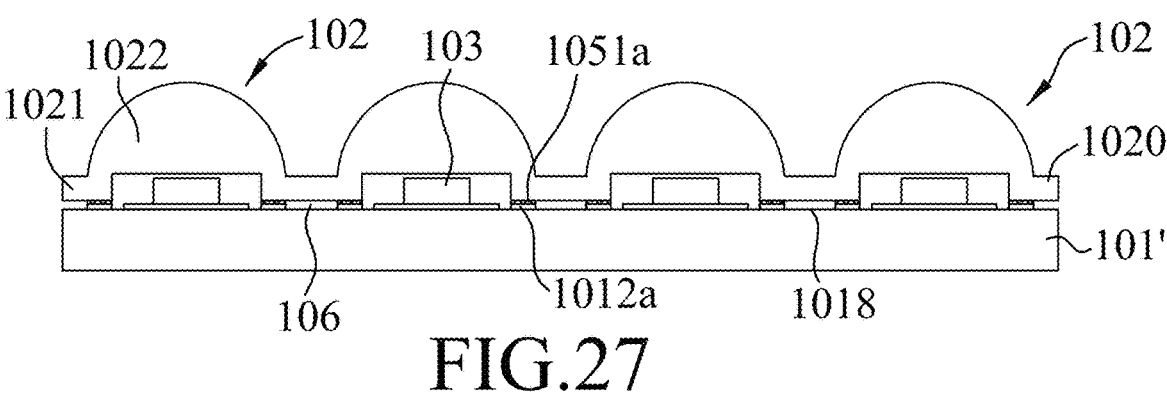
Figure 28:
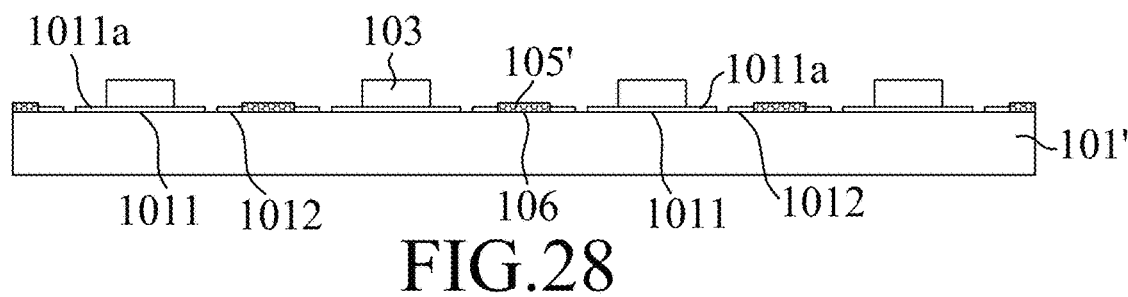

Referring to FIG. 20, this disclosure also provides a method for manufacturing the variation of the second embodiment of the LED device 100C shown in FIG. 16, which includes the following consecutive steps S201 to S206. FIGS. 21 to 30 illustrate intermediate stages of the method for manufacturing the variation of the second embodiment of the LED device 100C.

Steps 201 and 202 (see FIG. 21) are the same as steps S101 and S102 of the aforesaid method shown in FIG. 3, respectively, and therefore the details thereof are omitted for the sake of brevity.

Step S203 (see FIGS. 22 to 27) is generally similar to step S103, except for the following differences.

As shown in FIG. 22, the first portions 1051a of the first bonding layers 1051 of the bonding layers 105 are formed on the second metal layers 1012a, respectively, by directly applying a binder material on the second metal layers 1012a. The thickness of each of the first portions 1051a may range from 35 μm to 100 μm, such as approximately 50 μm. After this step, the light-transmissive unit 1020 is connected to the wafer 101' through the first portions 1051a, and covers the LED chips 103 with the first and second fixtures 1015, 1024.

In certain embodiments, step S203 may be performed in the same way as step S103. That is to say, the binder material 105' fills the trenches 106 (see FIG. 28), and is subsequently formed into the first portions 1051a that are respectively disposed on the second metal layers 1012a, and the second portions 1051b that are respectively disposed on the non-functional regions 1012 of the wafer 101' and that are respectively located outside the second metal layers 1012a.

Figure 29:
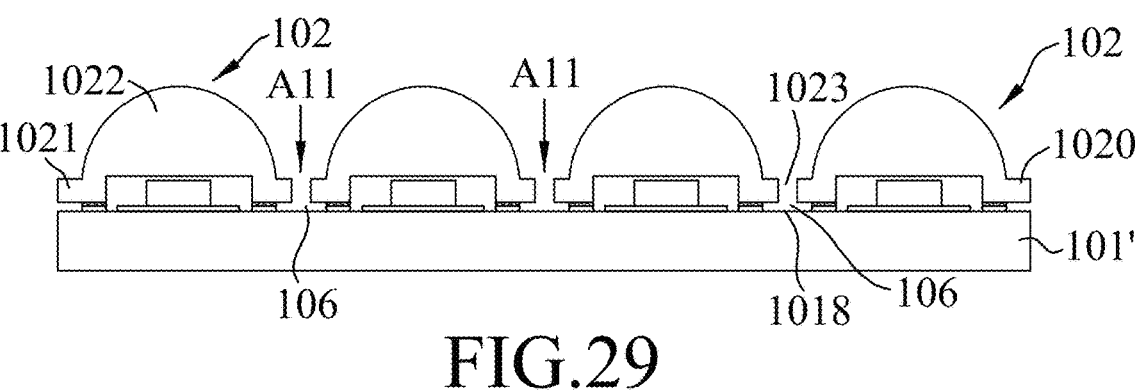

In step S204, a plurality of through holes 1023 are formed and are in correspondence with the dicing regions 1018, respectively (see FIG. 29).

As shown in FIG. 29, in this step, a first dicing process is performed on the light-transmissive unit 1020 along a dicing direction indicated by arrows A11, so as to form the through holes 1023. The through holes 1023 are spatially communicated with the trenches 106, respectively.

In step S205, a plurality of the second bonding layers 1052 are formed in the through holes 1023, respectively.

Figure 30:
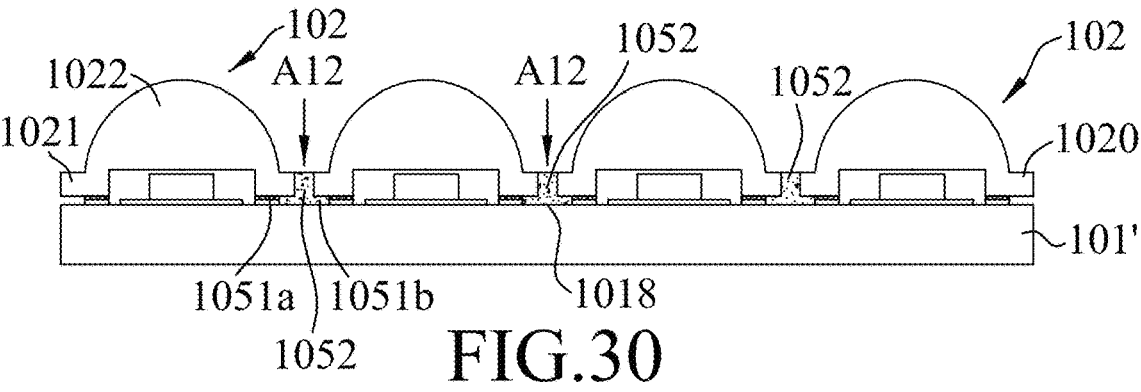

As shown in FIG. 30, in this step, a bonding material (i.e., a silica gel) fills the through holes 1023 and the trenches 106 (see FIG. 29), and is subsequently baked then cured so as to be formed into the second bonding layers 1052. In addition, since the trenches 106 in this embodiment are not filled with the first bonding layers 1051, the bonding material may flow into the trenches 106 between the mounting bases 1021 and the wafer 101', forming the second portions 1051b of the first bonding layers 1051.

In step S206, a second dicing process is performed on the dicing regions 1018 of the wafer 101', so as to obtain the LED devices 100C.

Specifically, the second dicing process is performed on the second bonding layers 1052 along a dicing direction indicated by arrows A12 (see FIG. 30), thereby obtaining the LED devices 100C. In a direction perpendicular to the dicing directions (indicated by the arrows A11 shown in FIG. 29 and the arrows A12 shown in FIG. 30), a width of each of second dicing lines in the second dicing process is smaller than that of a respective one of first dicing lines in the first dicing process, so that a portion of each of the second bonding layers 1052 is removed, and a residual portion of each of the second bonding layers 1052 remains on the sidewall of a corresponding one of the mounting bases 1021 and the sidewall of a corresponding one of the second portions 1051*b* of the first bonding layers 1051 and may have a certain width. In certain embodiments, the width of each of the first dicing lines may be two times the width of a respective one of the second dicing lines, and the width of the residual portion of each of the second bonding layers 1052 may be half of the width of a corresponding one of the second dicing lines.

Figure 31:
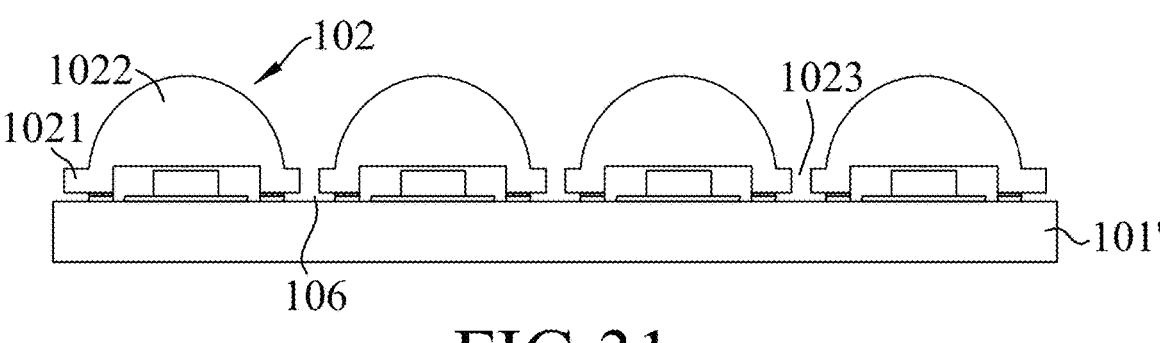

In certain embodiments, as shown in FIG. 31, in step S103 or S203, the light-transmissive elements 102 of the light-transmissive unit 1020 may be connected with or separated from each other.

Figure 32:
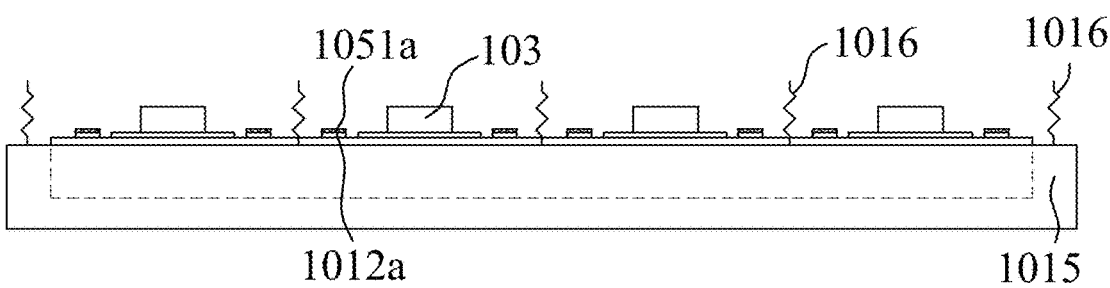
Figure 33:
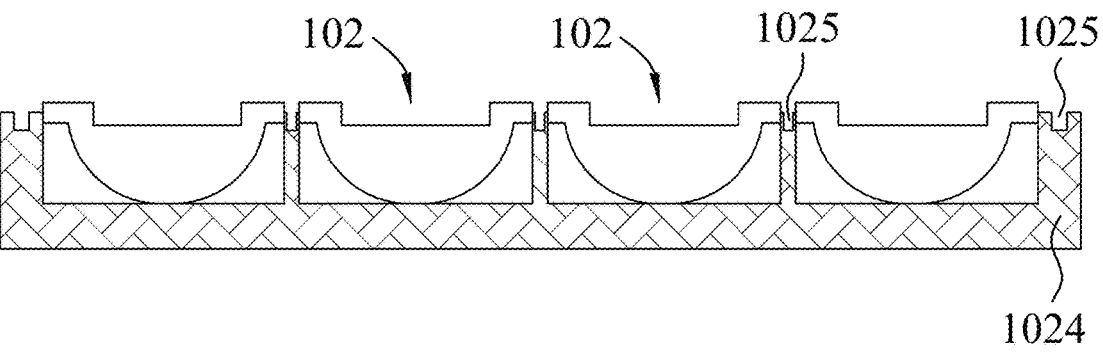

In certain embodiments, as shown in FIGS. 32 and 33, in step S203, the first fixture 1015 includes a plurality of the first positioning elements 1016 (5 of the first positioning elements 1016 (e.g., the positioning springs) as shown in FIG. 32), and the number of the second positioning element 1025 (e.g., the positioning hole) of the second fixture 1024 is in correspondence with the number of the first positioning element 1016. In such case, the second fixture 1024 has a plurality of the accommodating spaces, and the light-transmissive elements 102 that are separately formed are placed in the accommodating spaces of the second fixture 1024, respectively.

When the light-transmissive elements 102 of the light-transmissive unit 1020 are separated from each other (see FIG. 31) and respectively placed in the accommodating spaces of the second fixture 1024 (see FIG. 33) in step S203, step S204 may be omitted.

Figure 34:
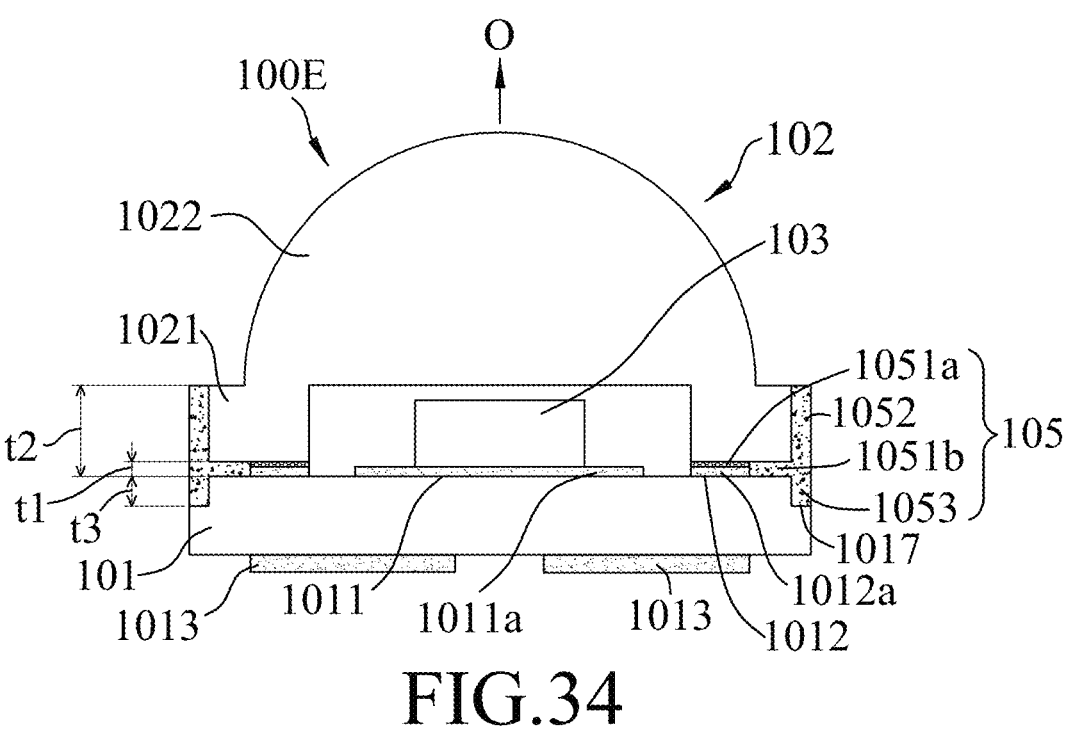
FIG. 34 is a schematic view illustrating a third embodiment of the LED device according to the disclosure.
Figure 35:
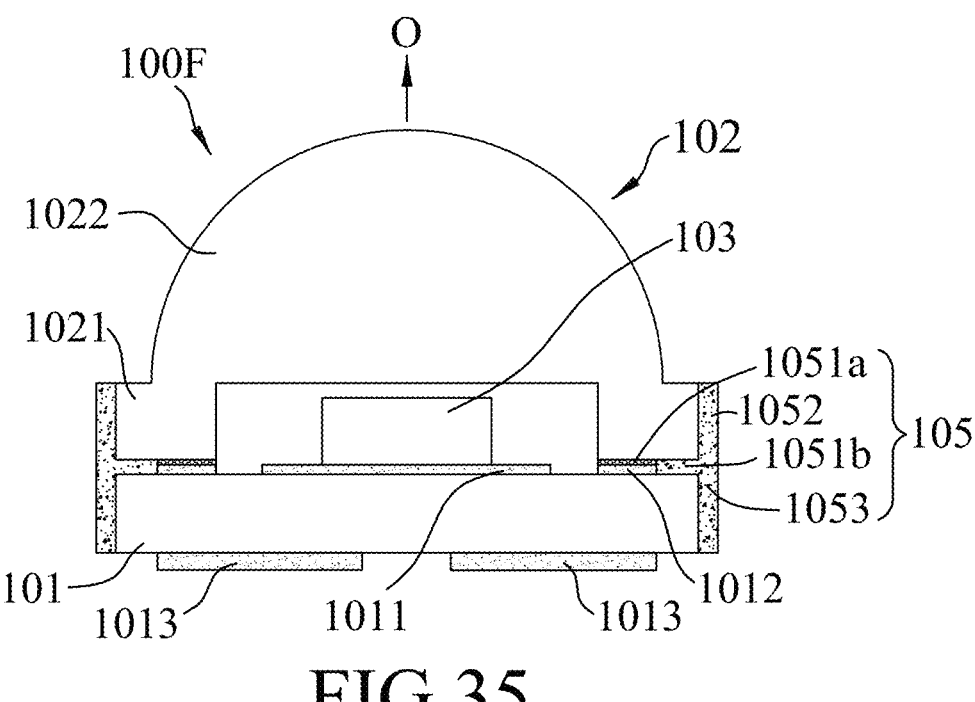
FIG. 35 is a schematic view illustrating a first variation of the third embodiment.

Referring to FIG. 34, a third embodiment of an LED device 100E according to the present disclosure is generally similar to the variation of the second embodiment shown in FIG. 16, except that, in the third embodiment, the bonding layer 105 further includes a third bonding layer 1053 disposed on at least a part of the sidewall of the substrate 101. In this embodiment, the third bonding layer 1053, the first bonding layer 1051, and the second bonding layer 1052 corporately form a continuous structure having a T shape. In a first variation of the third embodiment, as shown in FIG. 35, the third bonding layer 1053 is formed to completely cover the sidewall of the substrate 101.

As shown in FIG. 34, in this embodiment, the sidewall of the substrate 101 is formed with an indented platform 1017, and the third bonding layer 1053 is disposed on the indented platform 1017 and is connected to the second bonding layer 1052. By virtue of the continuous structure of the bonding layer 105 that is disposed on the sidewall of the mounting base 1021 and the at least a part of the sidewall of the substrate 101, the airtightness of the LED device 100E may be further enhanced.

A method for manufacturing the third embodiment of the LED device 100E is generally similar to the aforesaid method shown in FIG. 20 except for the following differences.

Figure 36:
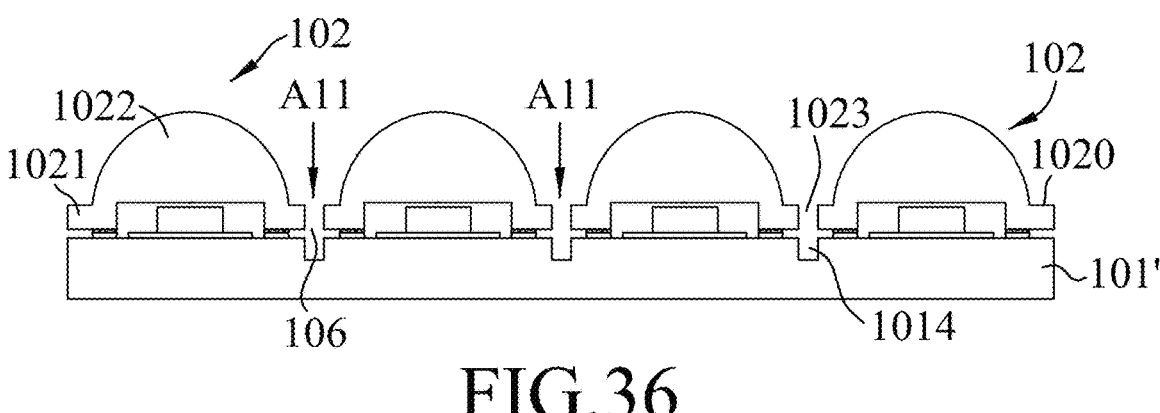
FIGS. 36 and 37 are schematic views illustrating some intermediate stages of a method for manufacturing the third embodiment of the LED device.
Figure 37:
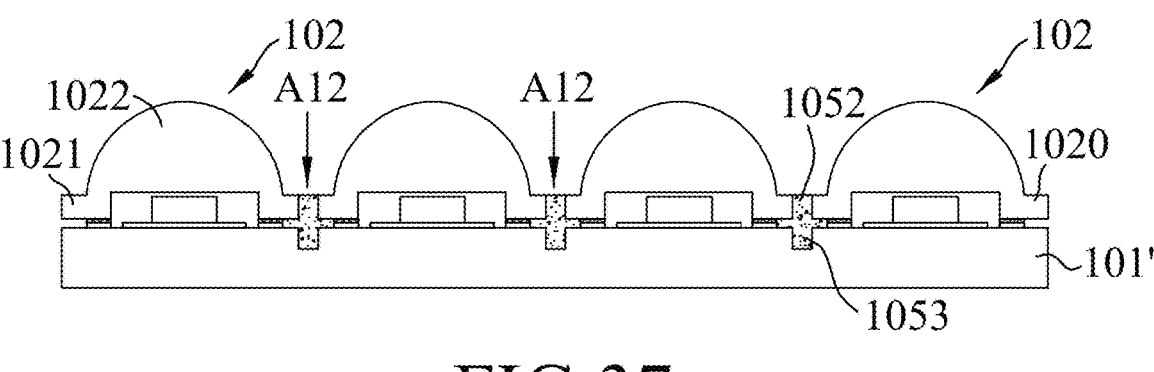

As shown in FIG. 36, after formation of the through holes 1023 and before the second dicing process, the first dicing process is continually performed on the wafer 101' along the dicing direction indicated by the arrows A11, so as to form a plurality of recesses 1014 in the wafer 101'. The recesses 1014 are respectively located in the dicing regions 1018 (not shown) of the wafer 101', and are spatially communicated with the through holes 1023, respectively. Afterwards, as shown in FIG. 37, a binder material fills the recesses 1014 and the through holes 1023, so that a plurality of the third bonding layers 1053 are respectively formed in the recesses 1014, and a plurality of the second bonding layers 1052 are respectively formed in the through holes 1023. Then, the second dicing process is performed along the dicing direction indicated by the arrows A12, so as to obtain the LED devices 100E shown in FIG. 34. The side surfaces of the second and third bonding layers 1052, 1053 are flush with the side surface of the substrate 101 in the thickness direction (O).

Figure 38:
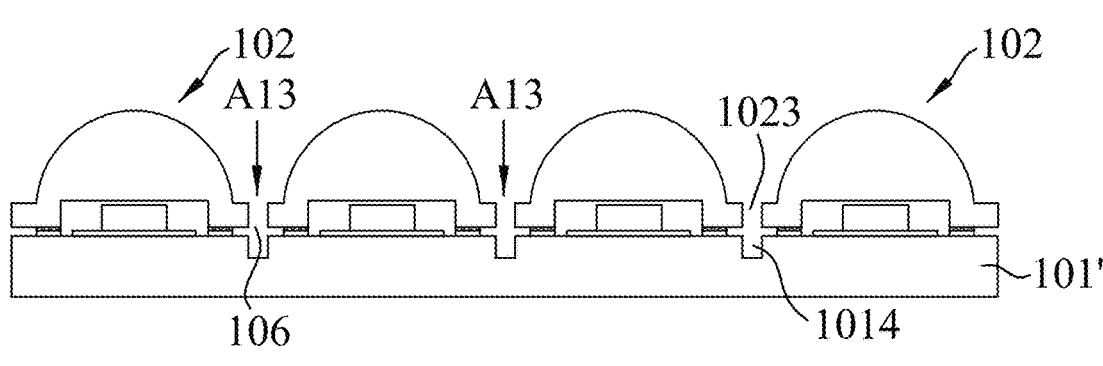
FIG. 38 is a schematic view illustrating a step of forming recesses of the third embodiment of the LED device according to the disclosure.

In certain embodiments, as shown in FIG. 38, when the light-transmissive elements 102 of the light-transmissive unit 1020 are independently disposed on the wafer 101' and are spaced apart from each other by the through holes 1023 (see FIG. 31), the structure shown in FIG. 31 is subjected to a dicing process along the dicing direction indicated by arrows A13, so as to form the recesses 1014 in the wafer 101'.

The recesses 1014 may have a depth ranging from ⅓ to ⅔ of a thickness of the wafer 101', so as to maintain a structural strength of the wafer 101' while forming the recesses 1014.

As shown in FIG. 34, the thickness (t1) of the first bonding layer 1051 in the thickness direction (O) may range from 35 μm to 150 μm. The thickness of the first portion 1051*a* in the thickness direction (O) may range from 35 μm to 50 μm, and the thickness of the second portion 1051*b* in the thickness direction (O) may range from 50 μm to 150 μm. The thickness (t2) of the second bonding layer 1052 may range from 200 μm to 400 μm. A thickness (t3) of the third bonding layer 1053 may range from ⅓ to ⅔ of the thickness of the substrate 101.

As shown in FIG. 35, the third bonding layer 1053 is completely formed on and covers the sidewall of the substrate 101. In this variation, the bonding layer 105 that includes the first, second, and third bonding layers 1051, 1052, 1053 covers the sidewall of the light-transmissive element 102 and the sidewall of the substrate 101, which may further enhance the airtightness of the LED device 100F.

A method for manufacturing the first variation of the third embodiment of the LED device 100F shown in FIG. 35 is generally similar to the method for manufacturing the third embodiment of the LED device 100E except for the following differences. Specifically, in the method for manufacturing the first variation of the third embodiment of the LED device 100F, after the formation of the through holes 1023, the first dicing process is continually performed on the wafer 101' that is fixedly placed in a fixture (e.g., the wafer 101' is adhered to an inner wall of the fixture through an adhesive film) so as to form the recesses 1014 that penetrate the wafer 101' in the thickness direction (O). After formation of the recesses 1014, the third bonding layers 1053 are formed in the recesses 1014, respectively. Afterwards, the second dicing process is performed, so as to obtain a plurality of the LED devices 100F.

Figure 39:
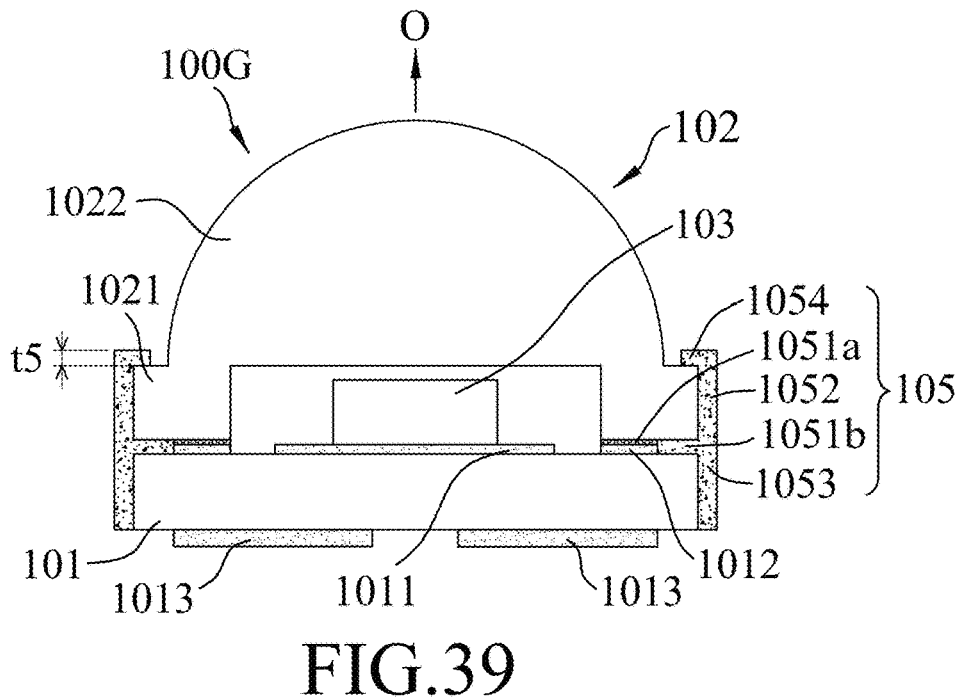
FIG. 39 is a schematic view illustrating a second variation of the third embodiment.

In a second variation of the third embodiment, as shown in FIG. 39, the bonding layer 105 of an LED device 100G further includes a fourth bonding layer 1054 formed on a part of the upper surface of the light-transmissive element 102. Specifically, the fourth bonding layer 1054 may be formed on at least a part of the upper surface of the mounting base 1021 of the light-transmissive element 102. In this variation, the fourth bonding layer 1054 is formed on a part of the upper surface of the mounting base 1021 of the light-transmissive element 102. It is noted that the fourth bonding layer 1054 may be formed on the entire upper surface of the mounting base 1021 of the light-transmissive element 102. The fourth bonding layer 1054 and the second bonding layer 1052 may corporately form a continuous structure. That is to say, the second bonding layer 1052 and the fourth bonding layer 1054 may be formed simultaneously. In the thickness direction (O), the thickness (t5) of the fourth bonding layer 1054 may range from 10 μm to 200 μm. By virtue of the bonding layer 105 covering the light-transmissive element 102, the airtightness of the LED device 100G may be further enhanced and the connection between the light-transmissive element 102 and the substrate 101 may be increased simultaneously.

Figure 40:
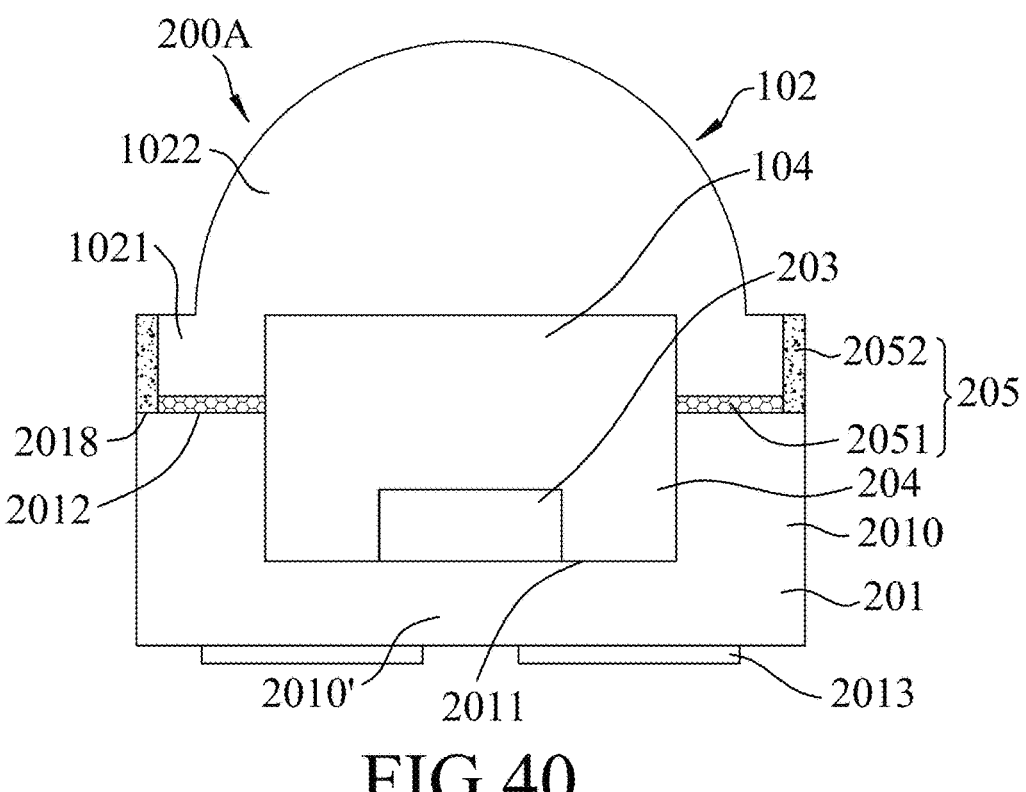
FIG. 40 is a schematic view illustrating a fourth embodiment of the LED device according to the disclosure.

Referring to FIG. 40, a fourth embodiment of an LED device 200A according to the present disclosure is generally similar to the second embodiment shown in FIG. 15, except that, in the fourth embodiment, the substrate 201 is formed with a receiving space, and thus has a cup structure.

In this embodiment, the substrate 201 includes a bottom portion 2010', and a surrounding portion 2010. The surrounding portion 2010 is connected to and extends upwardly from the bottom portion 2010', so as to form the receiving space. An upper surface of the bottom portion 2010' of the substrate 201 has the functional region 2011, and an upper surface of the surrounding portion 2010 has the non-functional region 2012 and the dicing region 2018. In certain embodiments, a metal layer (not shown) may be formed on the functional region 2011, and may have a thickness ranging from 30 μm to 100 μm, such as 50 μm.

In this embodiment, by virtue of the bonding layer 205 having the L-shaped structure, the airtightness and reliability of the LED device 200A may be enhanced.

Figure 41:
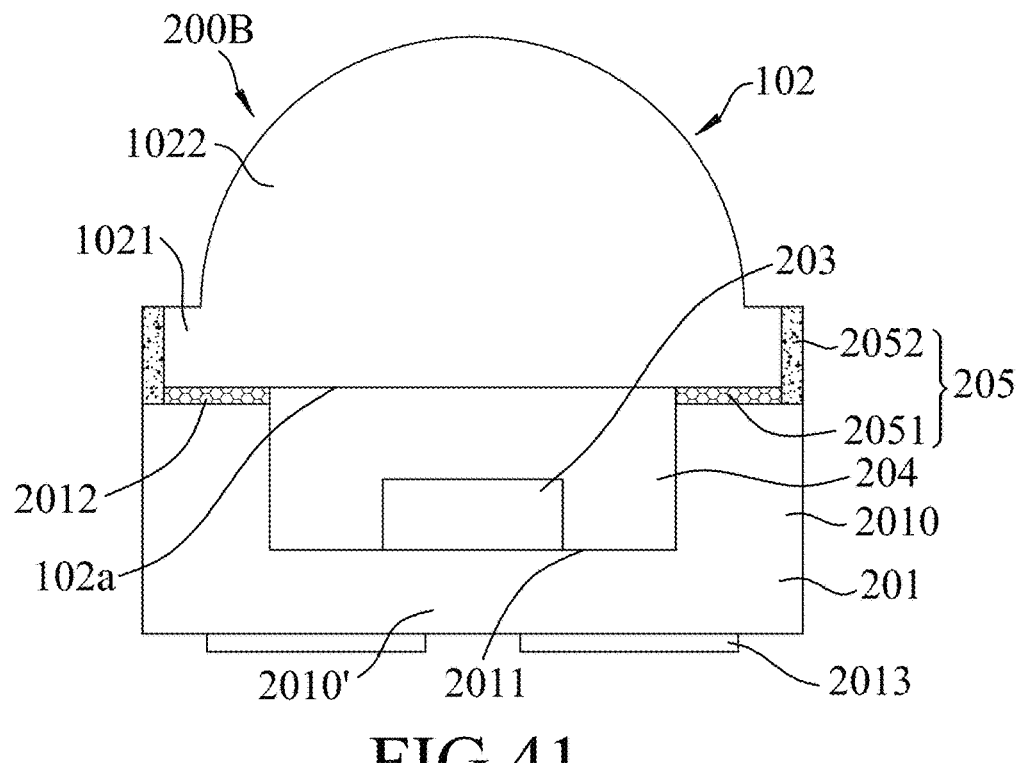
FIG. 41 is a schematic view illustrating a variation of the fourth embodiment.

In a variation of the fourth embodiment, as shown in FIG. 41, the light-transmissive element 102 has a lens structure, and the bottom surface 102a (proximate to the LED chip 203) of the light-transmissive region 1022 is flush with the bottom surface of the mounting base 1021. In this variation, the cavity 204 has a relatively smaller size as compared with the cavity 104 shown in FIG. 40.

With the structural design of the light-transmissive element 102 shown in FIG. 41, a distance between the light-transmissive element 102 and the LED chip 203 is reduced, so that the light-transmissive element 102 may provide better transmittance, which is conducive for enhancing the luminous efficiency of the LED device 200B.

Figure 42:
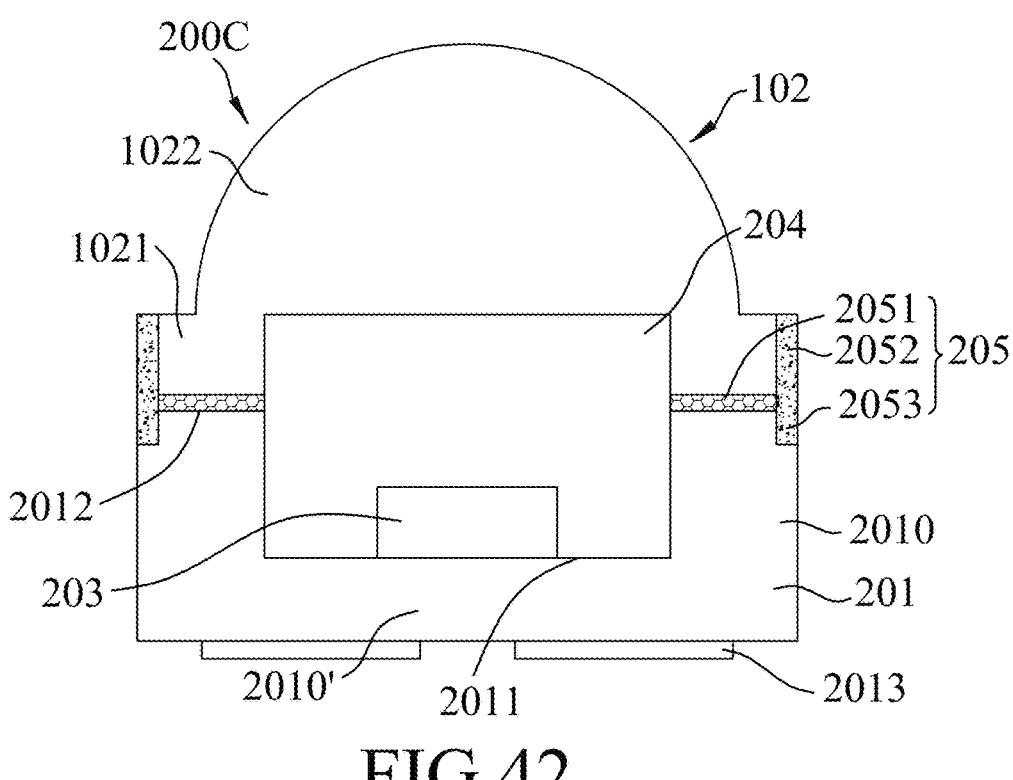
FIG. 42 is a schematic view illustrating a fifth embodiment of the LED device according to the disclosure.

Referring to FIG. 42, a fifth embodiment of an LED device 200C according to the present disclosure is generally similar to the fourth embodiment shown in FIG. 40, except that, in the fifth embodiment, the bonding layer 205 further includes a third bonding layer 2053 disposed on at least a part of the sidewall of the substrate 201. In this embodiment, the third bonding layer 2053, the first bonding layer 2051, and the second bonding layer 2052 corporately form a continuous structure having a T shape. In certain embodiments, the third bonding layer 2053 may cover the entire sidewall of the substrate 201.

By virtue of the aforesaid bonding layer 205 having the T-shaped structure, the airtightness and reliability of the LED device 200C may be enhanced.

Figure 43:
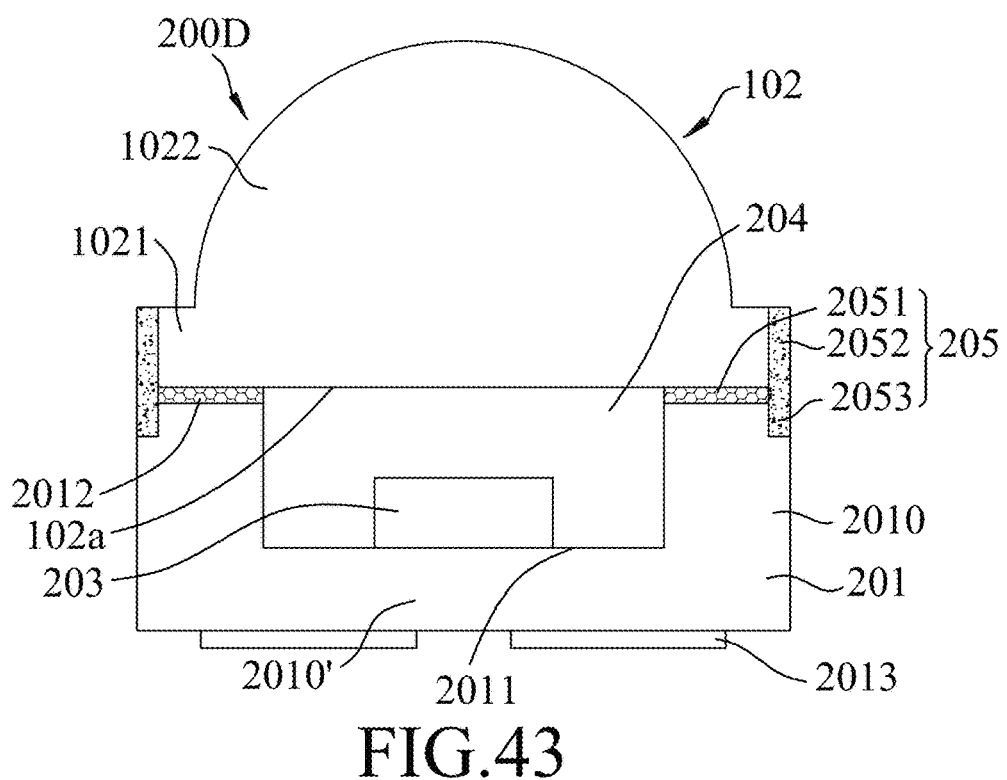
FIG. 43 is a schematic view illustrating a variation of the fifth embodiment.

In a variation of the fifth embodiment, as shown in FIG. 43, the light-transmissive element 102 has the lens structure, and the bottom surface 102a (proximate to the LED chip 203) of the light-transmissive region 1022 is flush with the bottom surface of the mounting base 1021. In this variation, the cavity 204 has a relatively smaller size as compared to the size of the cavity 204 shown in FIG. 42. With the structural design of the light-transmissive element 102, the distance between the light-transmissive element 102 and the LED chip 203 is reduced, so that the light-transmissive element 102 may provide better transmittance, which is conducive for enhancing the luminous efficiency of the LED device 200D. In certain embodiments, in this variation, the third bonding layer 2053 may cover the entire sidewall of the substrate 201.

Figure 44:
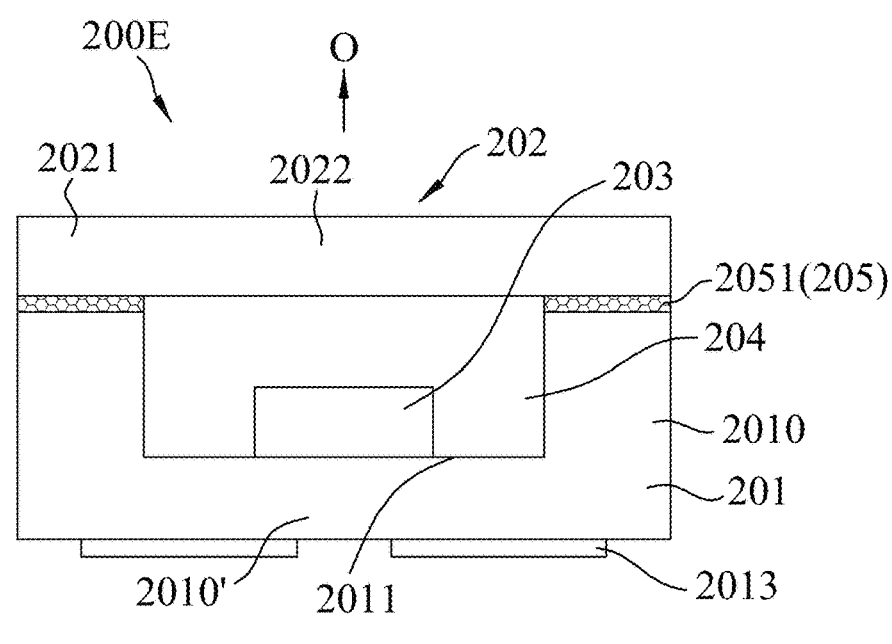
FIG. 44 is a schematic view illustrating a sixth embodiment of the LED device according to the disclosure.

Referring to FIG. 44, a sixth embodiment of an LED device 200E according to the present disclosure is generally similar to the fourth embodiment shown in FIG. 40, except that, in the sixth embodiment, the bonding layer 205 only has the first bonding layer 2051, and the light-transmissive element 202 has a plate structure. In this embodiment, the sidewall of the light-transmissive element 202 is aligned with the sidewall of the bonding layer 205 and the sidewall of the substrate 201 in the thickness direction (O), which is conducive for the LED device 200E to be placed in a better location in the vibrator bowl feeder, and further enhancing a packaging yield of the LED device 200E.

Figure 45:
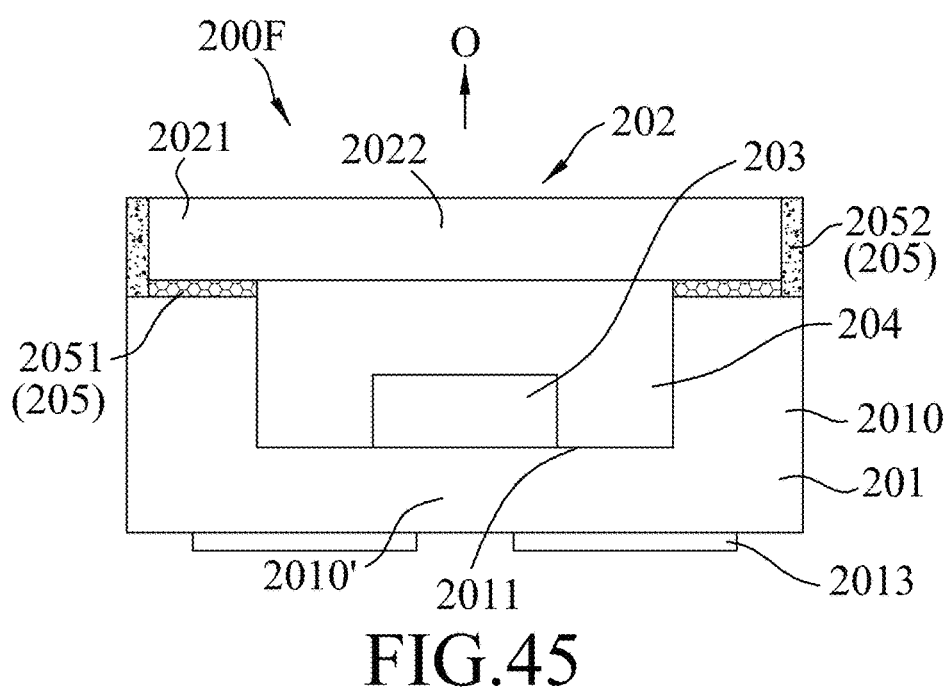
FIG. 45 is a schematic view illustrating a variation of the sixth embodiment.

In a variation of the sixth embodiment, as shown in FIG. 45, the bonding layer 205 further includes the second bonding layer 2052 that is disposed on the upper surface of the surrounding portion 2010 of the substrate 201 and that covers the sidewall of the light-transmissive element 202. The light-transmissive element 202 may be made of one of a flat quartz glass and a plastic material. In this variation, the light-transmissive element 202 is made of a quartz glass. The thickness of the light-transmissive element 202 is smaller than that of each of the LED chip 203 and the surrounding portion 2010 of the substrate 201. In certain embodiments, the thickness of the light-transmissive element 202 may be approximately 350 μm, the thickness of the LED chip 203 may be approximately 500 μm, and the thickness of the surrounding portion 2010 of the substrate 201 may be greater than 1000 μm. The mounting base 2021 is connected to the upper surface of the surrounding portion 2010 of the substrate 201 through the bonding layer 205, and the light-transmissive region 2022 simultaneously covers the cup structure of the substrate 201 and the LED chip 203. In this variation, the first bonding layer 2051 and the second bonding layer 2052 corporately form a continuous structure that has an L shape and that covers the sidewall of the light-transmissive element 202, which may significantly enhance the connection between the light-transmissive element 202 and the substrate 201, and improve the airtightness of the LED device 200F. In this variation, the thickness of the first bonding layer 2051 is smaller than that of the second bonding layer 2052. The thickness of the first bonding layer 2051 may range from 35 μm to 150 μm, and the thickness of the second bonding layer 2052 may range from 200 μm to 400 μm. In addition, the sidewall of the second bonding layer 2052 is aligned with the sidewall of the substrate 201 in the thickness direction (O), which is conducive for the LED device 200F to be placed in a better location in the vibrator bowl feeder and for improving a packaging yield of the LED device 200F, while enhancing the airtightness of the LED device 200F.

Figure 46:
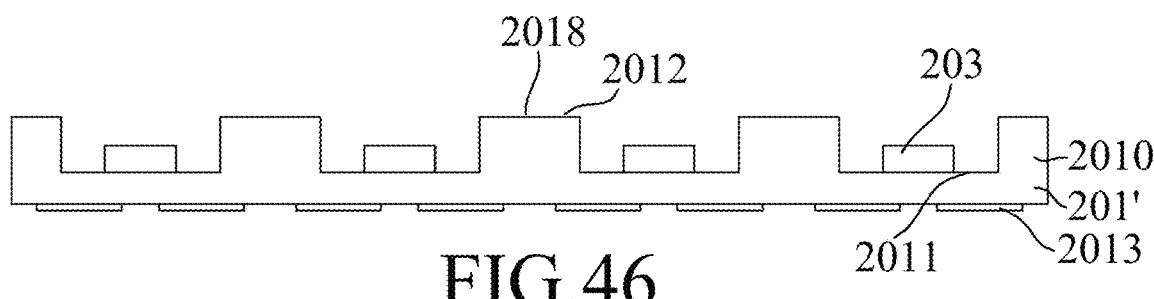
FIGS. 46 to 48 are schematic views illustrating some intermediate stages of a method for manufacturing the sixth embodiment of the LED device.
Figure 47:
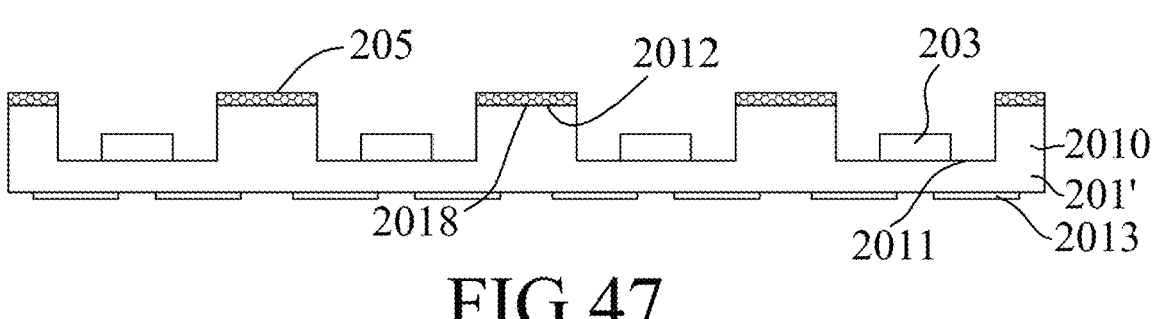
Figure 48:
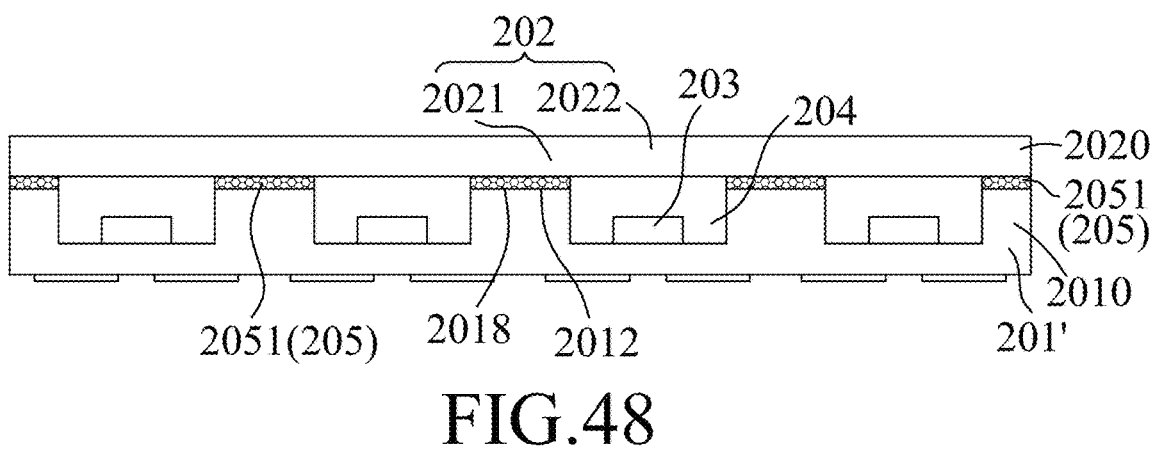

A method for manufacturing the sixth embodiment of the LED device 200E includes the following consecutive steps S201 to S204 that are generally similar to the consecutive steps S101 to S104 of the aforesaid method shown in FIG. 3, except for the following differences. FIGS. 46 to 48 illustrate intermediate stages of the method for manufacturing the sixth embodiment of the LED device 200E.

As shown in FIG. 46, in step S201, the wafer 201' having a plurality of the receiving spaces is provided. The wafer 201' has the first surface and the second surface opposite to the first surface. The first surface is shaped to form the receiving spaces, and has the functional regions 2011 respectively in the receiving spaces and the non-functional regions 2012 among the receiving spaces. The electrode pads 2013 are disposed on the second surface. The metal layer (not shown) may be formed on the functional regions 2011 by deposition and etching. The dicing regions 2018 are located among the receiving spaces and overlap the non-functional regions 2012.

As shown in FIGS. 47 and 48, in step S203, the bonding layers 205 are formed on the non-functional regions 2012 (see FIG. 47). The bonding layers 205 are made of a binder material having a certain flowability, and the thickness of the bonding layer 205 is smaller than 50 μm. After formation of the bonding layers 205, the light-transmissive unit 2020 is connected to the wafer 201', so as to obtain a lighting workpiece (see FIG. 48). Afterwards, step 204 (i.e., the dicing process) is performed, so as to obtain a plurality of the LED devices 200E (see FIG. 44).

Figure 49:
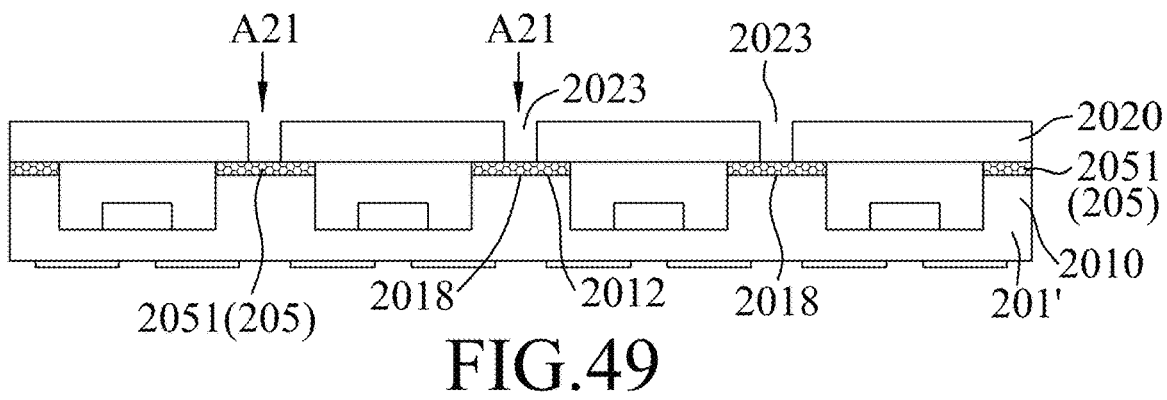
FIGS. 49 and 50 are schematic views illustrating some intermediate stages of a method for manufacturing the variation of the sixth embodiment.
Figure 50:
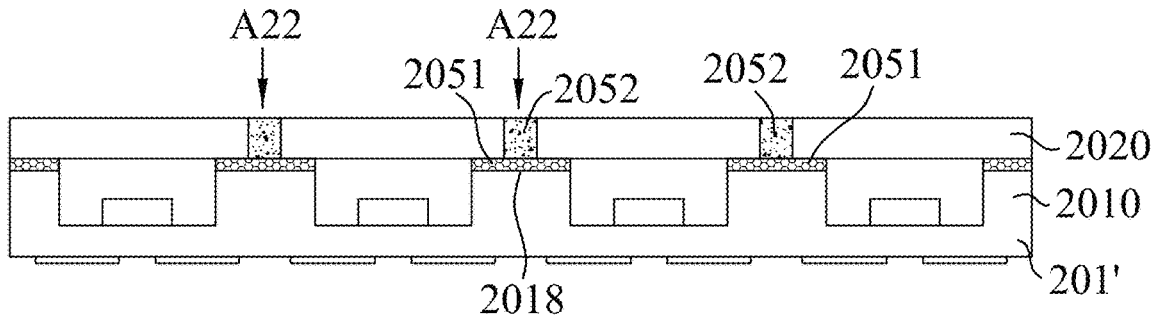

A method for manufacturing the variation of the sixth embodiment of the LED device 200F shown in FIG. 45 includes the consecutive steps S301 to S306, wherein steps S301 to S303 are the same as the steps S201 to S203 of the aforesaid method for manufacturing the sixth embodiment of the LED device 200E. FIGS. 49 and 50 illustrate intermediate stages of the method for manufacturing the variation of the sixth embodiment of the LED device 200F.

As shown in FIG. 49, in step S304, a plurality of the through holes 2023 are formed in the light-transmissive unit 2020 and are located above the dicing regions 2018, respectively.

In this step, the first dicing process is performed on the structure shown in FIG. 48 along the dicing direction indicated by arrows A21 shown in FIG. 49, so as to form the through holes 2023.

As shown in FIG. 50, in step S305, a plurality of the second bonding layers 2052 are formed in the through holes 2023, respectively. Each of the second bonding layers 2052 may cooperate with a corresponding one of the first bonding layers 2051 to form a continuous structure.

In step S306, the second dicing process is performed on the second bonding layers 1052 along the dicing direction indicated by arrows A22 shown in FIG. 50, so as to obtain a plurality of the LED devices 200F.

In this step, in a direction perpendicular to the dicing direction (i.e., indicated by the arrows A21 and A22 respectively shown in FIGS. 49 and 50), a width of each of second dicing lines in the second dicing process is smaller than that of a respective one of first dicing lines in the first dicing process, so that a portion of each of the second bonding layers 2052 is removed, and a residual portion of each of the second layers 2052 remains on the light-transmissive unit 2020. In certain embodiments, the width of each of the first dicing lines may be two times the width of a respective one of the second dicing lines, and the width of each of the second bonding layers 2052 may be two times the width of a corresponding one of the second dicing lines.

Figure 51:
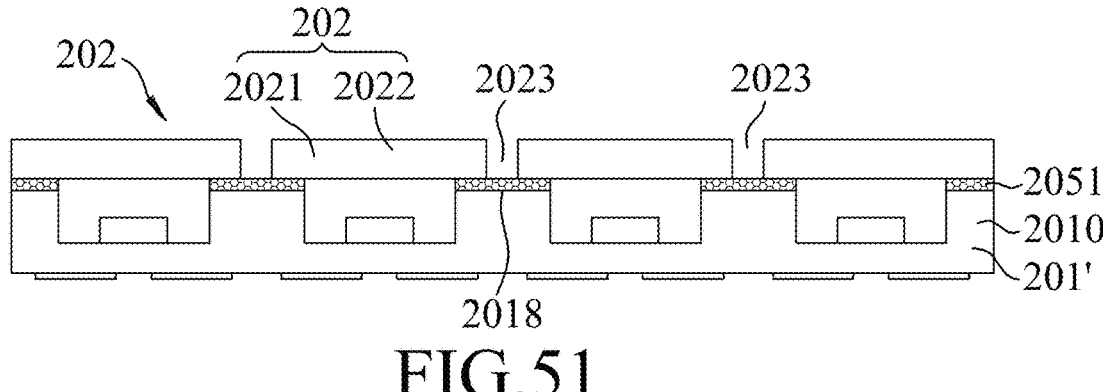
FIG. 51 is a schematic view illustrating an intermediate stage of a method for manufacturing another variation of the sixth embodiment.

In certain embodiments, in step S303, the light-transmissive unit 2020 includes a plurality of the light-transmissive elements 202 that are separated from each other. Each of the light-transmissive elements 202 is made of quartz glass. The light-transmissive elements 202 may be obtained by dicing the light-transmissive unit 2020, or may be formed separately. As shown in FIG. 51, in step S303, the light-transmissive elements 202 are connected to the wafer 201', and are separated by the through holes 2023. In such case, step S304 (i.e., the first dicing process) can be omitted.

Afterwards, steps S305 and S306 are sequentially performed, so as to obtain the LED devices 200E (see FIG. 44).

Figure 52:
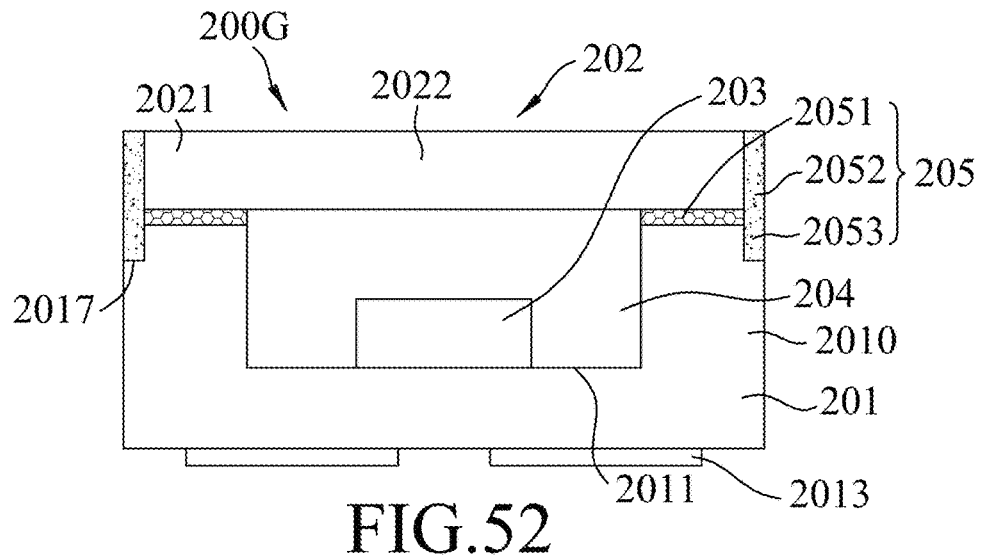
FIG. 52 is a schematic view illustrating a seventh embodiment of the LED device according to the disclosure.

Referring to FIG. 52, a seventh embodiment of an LED device 200G according to the present disclosure is generally similar to the variation of the sixth embodiment shown in FIG. 45, except that, in the seventh embodiment, the bonding layer 205 further includes a third bonding layer 2053. In this embodiment, the third bonding layer 2053, the first bonding layer 2051, and the second bonding layer 2052 may corporately form a T-shaped structure.

As shown in FIG. 52, an outer sidewall of the surrounding portion 2010 of the substrate 201 is formed with an indented platform 2017, and the third bonding layer 2053 is formed on the indented platform 2017 and is connected to the first bonding layer 2051 and the second bonding layer 2052. In this embodiment, the bonding layer 205 covers the sidewall of the light-transmissive element 202 and a part of the sidewall of the substrate 201, thereby enhancing the airtightness of the LED device 200G.

Figure 53:
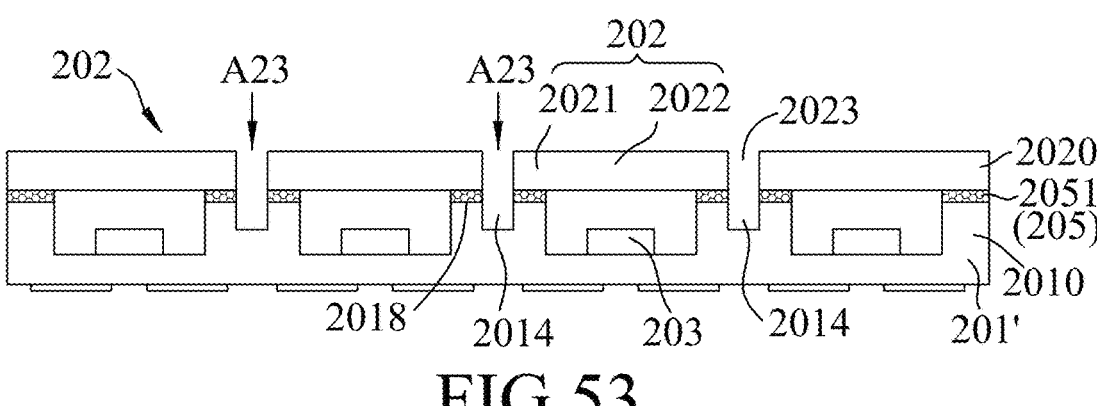
FIGS. 53 and 54 are schematic views illustrating some intermediate stages of a method for manufacturing the seventh embodiment of the LED device according to the disclosure.
Figure 54:
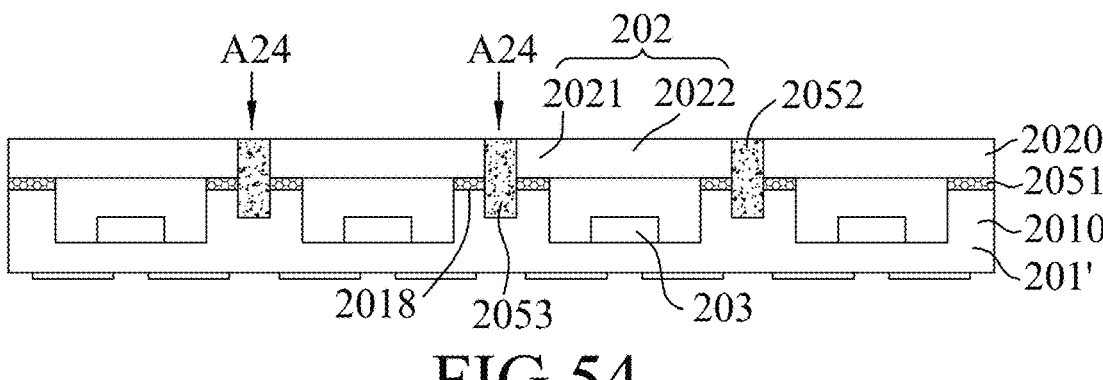

Referring to FIGS. 53 and 54, a method for manufacturing the seventh embodiment is generally similar to the aforesaid method for manufacturing the variation of the sixth embodiment, except for the following differences.

As shown in FIG. 53, after formation of the through holes 2023, the first dicing process is continually performed along the dicing direction indicated by arrows A23, so as to form the recesses 2014 located in the dicing regions 2018 of the wafer 201'. The recesses 2014 are spatially communicated with the through holes 2023, respectively. Afterwards, as shown in FIG. 54, a binder material fills the recesses 2014 and the through holes 2023, so as to form the third bonding layers 2053 and the second bonding layers 2052. Then, the second dicing process is performed on the structure shown in FIG. 54 along the dicing direction indicated by arrows A24, so as to obtain a plurality of the LED devices 200G (see FIG. 52).

Figure 55:
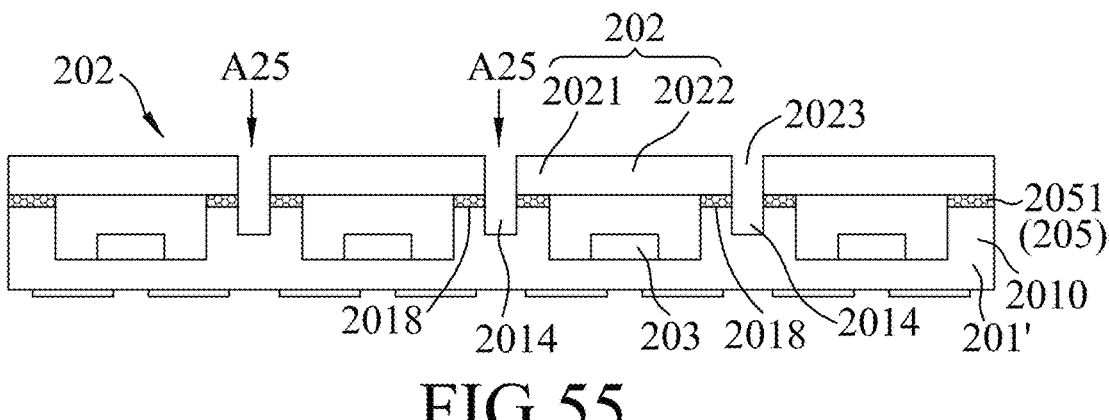
FIG. 55 is a schematic view illustrating an example of forming recesses of the seventh embodiment of the LED device according to the disclosure.

In certain embodiments, as shown in FIG. 55, when the light-transmissive elements 202 of the light-transmissive unit 2020 are independently disposed on the wafer 201' and are spaced apart from each other by the through hole 2023, dicing the light-transmissive unit 2020 is omitted. In such case, the first dicing process is performed only on the wafer 201' along the dicing direction indicated by arrows A25 so as to form the recesses 2014 in the dicing regions 2018 of the wafer 201'. In certain embodiments, a depth of the recesses 2014 may be about one half of the thickness of the wafer 201' in the dicing direction or smaller than one half of the thickness of the wafer 201', so as to maintain the structural strength of the wafer 201' while forming the recesses 2014.

After the formation of the recesses 2014, the subsequent steps (i.e., formation of the third and second bonding layers 2053, 2052 and the second dicing process) are performed, thereby obtaining the LED devices 200G.

Figure 56:
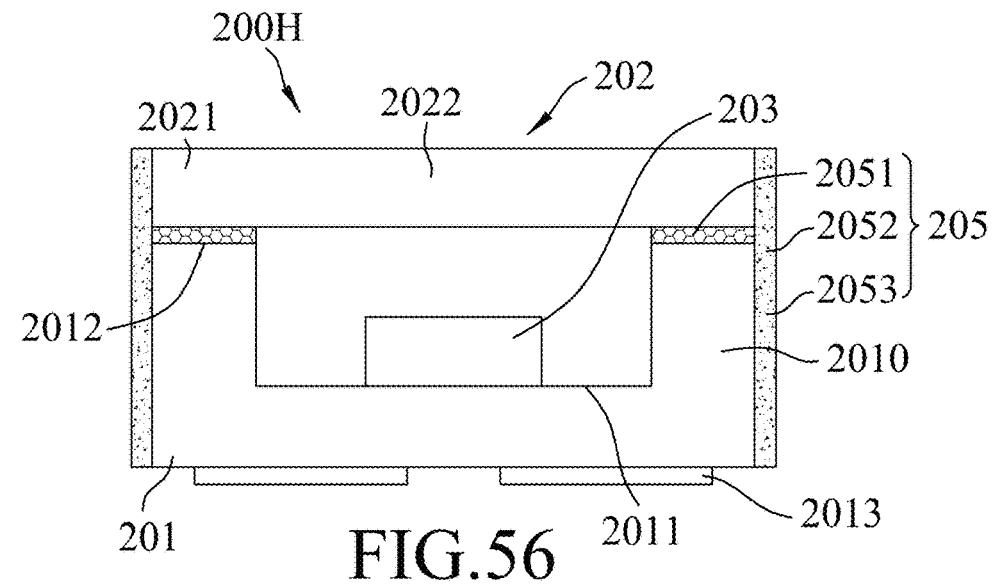
FIG. 56 is a schematic view illustrating a variation of the seventh embodiment.

In a variation of the seventh embodiment, as shown in FIG. 56, the third bonding layer 2053 may be formed to completely cover the sidewall of the surrounding portion 2010 of the substrate 201. In this variation, the bonding layer 205 that includes the first, second, and third bonding layers 2051, 2052, 2053 covers the sidewall of the light-transmissive element 202 and the sidewall of the substrate 201, so as to further enhance the airtightness of the LED device 200H.

A method for manufacturing the variation of the seventh embodiment of the LED device 200H is generally similar to the aforesaid method for manufacturing the seventh embodiment of the LED device 200G, except that, in the method for manufacturing the variation of the seventh embodiment of the LED device 200H, the recesses 2014 penetrate the wafer 201' that is fixedly placed in a fixture (e.g., the wafer 201' is adhered to an inner wall of the fixture through an adhesive film), and a binder material (not shown) subsequently fills the recesses 2014, so as to form the third bonding layers 2053 in the recesses 2014, respectively.

Figure 57:
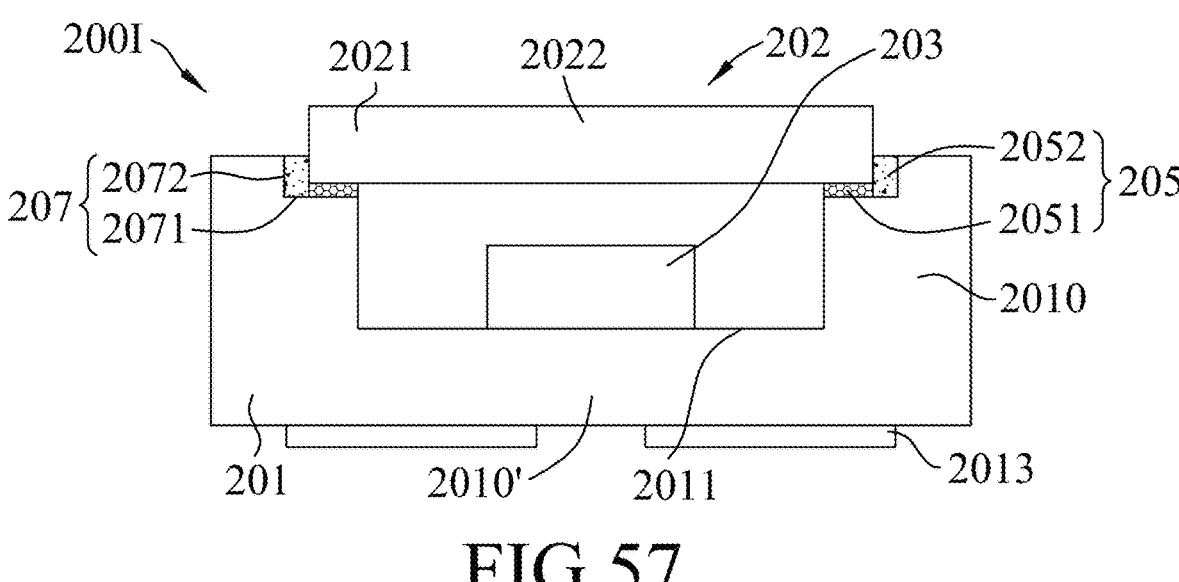
FIG. 57 is a schematic view illustrating an eighth embodiment of the LED device according to the disclosure.

Referring to FIG. 57, an eighth embodiment of an LED device 200I according to the present disclosure is generally similar to the variation of the sixth embodiment shown in FIG. 45, except for the following differences. Specifically, the surrounding portion 2010 of the substrate 201 is formed with an indentation 207 that is indented from the upper surface of the surrounding portion 2010 toward the bottom portion 2010'. The indentation 207 is located proximate and is spatially communicated with the receiving space. The indentation 207 is defined by a base surface 2071 and a peripheral surface 2072 interconnected the base surface 2071 and the upper surface of the surrounding portion 2010. The first bonding layer 2051 of the bonding layer 205 is located between the base surface 2071 and the mounting base 2021 of the light-transmissive element 202. The second bonding layer 2052 of the bonding layer 205 is located between the peripheral surface 2072 and the sidewall of the light-transmissive element 202. In this embodiment, the first bonding layer 2051 and the second bonding layer 2052 may corporately form a continuous structure that has an L shape and that partially covers the light-transmissive element 202, thereby enhancing the connection between the light-transmissive element 202 and the substrate 201, and the airtightness of the LED device 200I.

Figure 58:
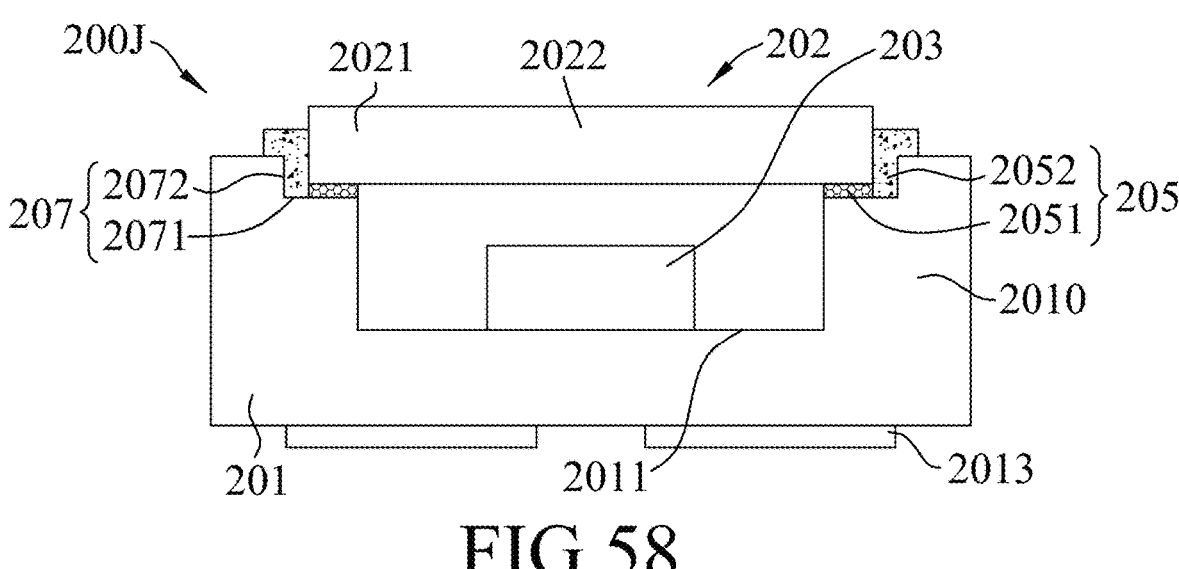
FIG. 58 is a schematic view illustrating a first variation of the eighth embodiment.

In a first variation of the eighth embodiment, as shown in FIG. 58, the second bonding layer 2052 is not only located between the peripheral surface 2072 and the sidewall of the light-transmissive element 202, but also extends onto a part of the upper surface of the surrounding portion 2010. The first bonding layer 2051 and the second bonding layer 2052 corporately form a continuous structure having a Z shape. In this variation, a contact area among the second bonding layer 2052, the substrate 201 and the light-transmissive element 202 increases, thereby further enhancing the connection between the substrate 201 and the light-transmissive element 202, and the airtightness of the LED device 200J.

Figure 59:
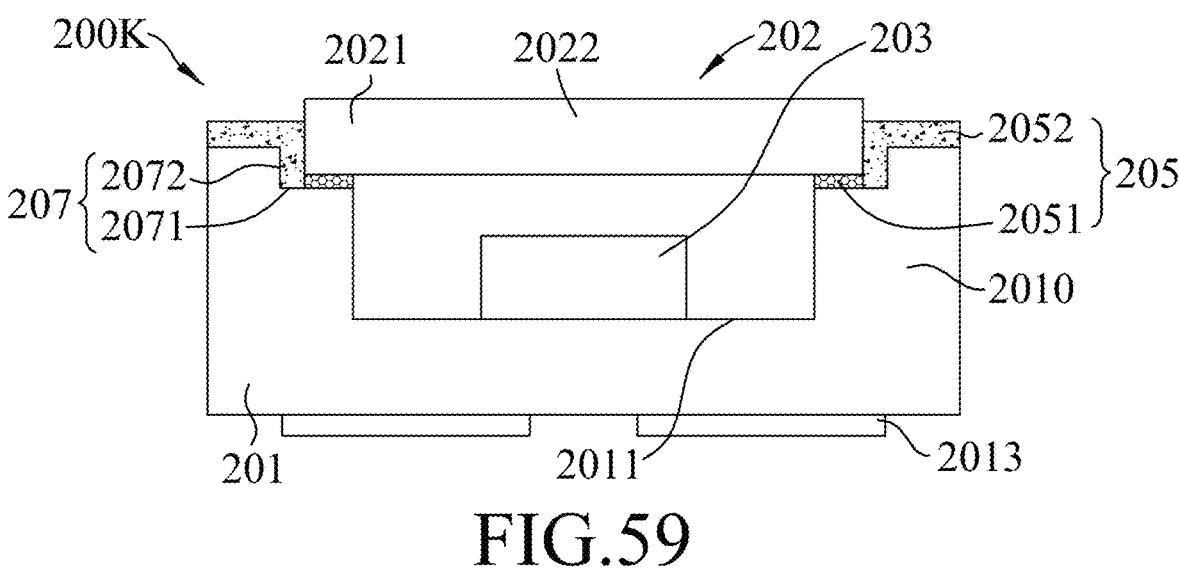
FIG. 59 is a schematic view illustrating a second variation of the eighth embodiment.

In a second variation of the eighth embodiment, as shown in FIG. 59, the second bonding layer 2052 extends onto and is formed on the entire upper surface of the surrounding portion 2010.

Figure 60:
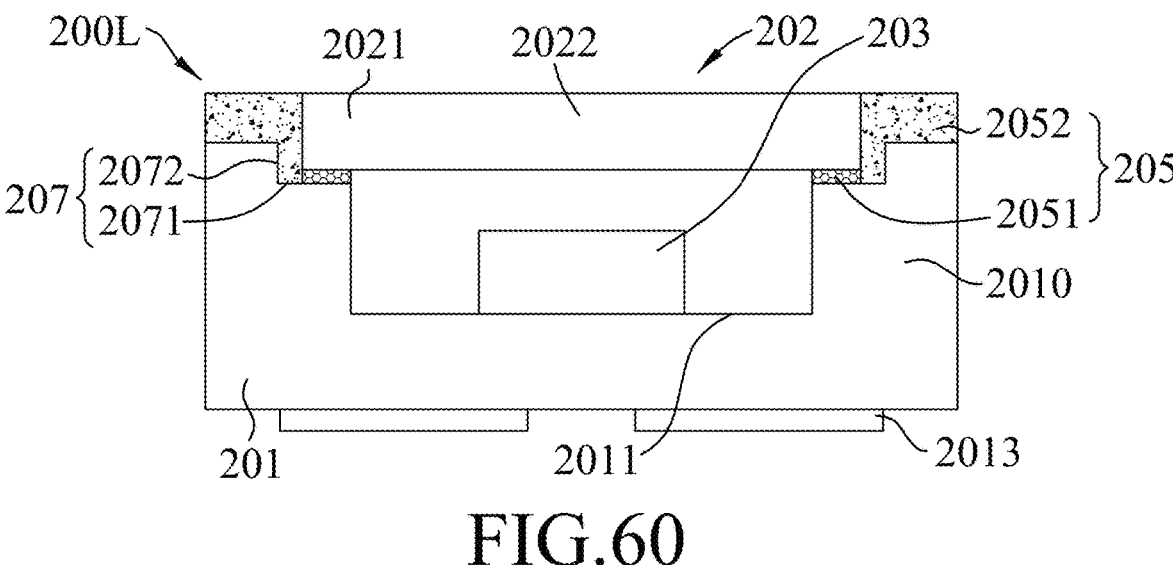
FIG. 60 is a schematic view illustrating a third variation of the eighth embodiment.

In a third variation of the eighth embodiment, as shown in FIG. 60, the second bonding layer 2052 extends onto and is formed on the entire upper surface of the surrounding portion 2010, and an upper surface of the second bonding layer 2052 is flush with the upper surface of the light-transmissive element 202, so that the second bonding layer 2052 completely covers the sidewall of the light-transmissive element 202. In certain embodiments, the upper surface of the second bonding layer 2052 may be located at a level higher than that of the upper surface of the light-transmissive element 202, and may extend onto and be formed on a part of the upper surface of the light-transmissive element 202, so as to partially enclose the light-transmissive element 202.

To determine the airtightness of the LED device according to this disclosure, samples of three LED devices 100A, 100C, 100E of this disclosure are prepared.

Helium (He) gas leakage test.

Figure 61:
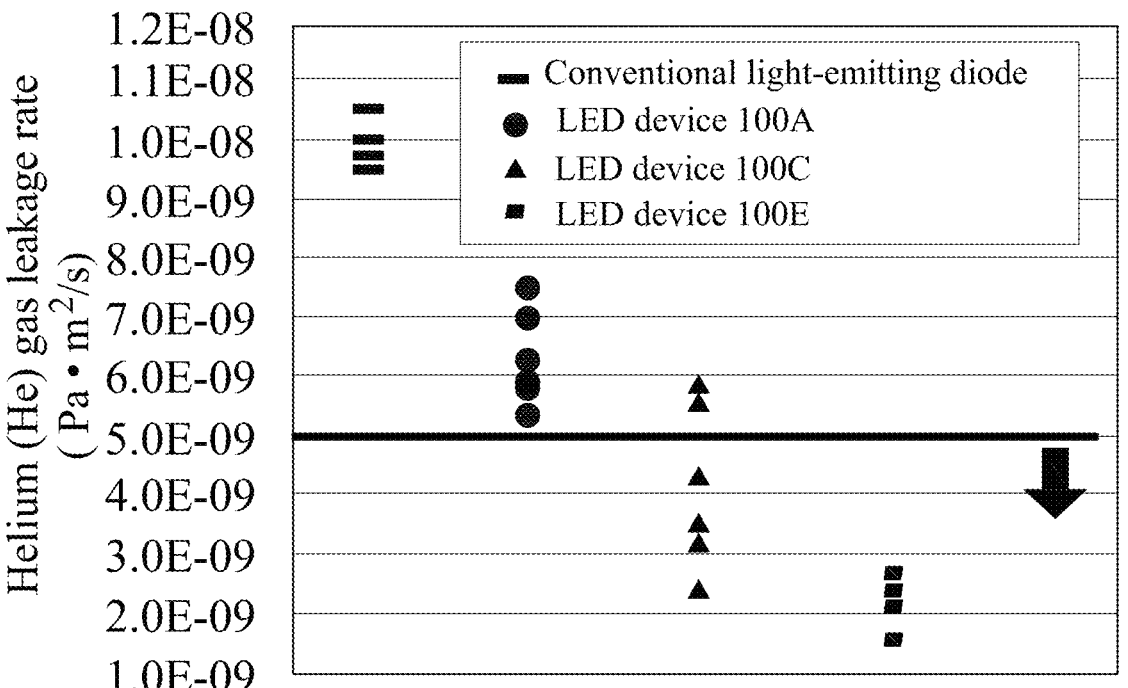
FIG. 61 is a plot showing a helium gas leakage rate of the LED devices shown in FIGS. 1, 16 and 34.

The samples of three LED devices 100A, 100C, 100E (respectively shown in FIGS. 1, 16 and 34) are placed in a helium gas leakage tester and are then subjected to a helium gas leakage test. The result is shown in FIG. 61. As shown in FIG. 61, compared with a conventional LED device having a structure similar to the structure shown in FIG. 1 (w/o the second portion 1051b of the first bonding layer 1051), the helium gas leakage rate of the samples of the LED device 100A obviously decreases. The helium gas leakage rate of the conventional LED device is greater than 9.0× 10–9 Pa·m²/s. The helium gas leakage rate of each of the samples of the LED devices 100A, 100C, 100E is obviously lower than 9.0×10–9 Pa·m²/s, and the helium gas leakage rate of most of the samples of the LED devices 100A, 100C, 100E is 6.0×10–9 Pa·m²/s. Therefore, compared with the conventional LED device, the airtightness and reliability of the LED devices 100A, 100C, 100E of this disclosure obviously increase.

The helium gas leakage rate of the samples of the LED devices 100C, 100E is lower than that of the samples of the LED device 100A. Specifically, the helium gas leakage rate of the samples of the LED device 100E is lower than 3.5×10–9 Pa·m²/s, and the helium gas leakage rate of 80% of a number of the samples of the LED device 100C is lower than 5.0×10–9 Pa·m²/s. In view of above, the LED devices having the L-shaped bonding layer 105 (i.e., the LED device 100C) or the T-shaped bonding layer 105 (i.e., the LED device 100E) might have increased airtightness and reliability.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting diode (LED) device, comprising:
   a substrate having a first surface and a second surface opposite to said first surface in a thickness direction, said first surface having a functional region;
   an LED chip disposed on said functional region of said first surface of said substrate;

a light-transmissive element disposed on said first surface of said substrate, and covering said LED chip; and a bonding layer connecting said substrate with said light-transmissive element, and disposed on said substrate outside said functional region, wherein said LED device has a surrounding surface, cross sections of said surrounding surface in said thickness direction being straight lines that extend in said thickness direction, and wherein said bonding layer includes a first bonding layer and a second bonding layer that are made of different materials, said first bonding layer being disposed on said substrate and connecting said substrate with said light-transmissive element, said second bonding layer being disposed on a sidewall of each of said first bonding layer and said light-transmissive element, said sidewall of each of said first bonding layer and said light-transmissive element being transverse to said first surface of said substrate.

2. The LED device as claimed in claim 1, wherein said substrate is a flat substrate, and said LED device further includes a first metal layer and a second metal layer, each of said first metal layer and said second metal layer having a top surface that is located at a level higher than that of said first surface of said substrate, said first metal layer being formed on said functional region, said second metal layer being formed on said substrate outside said functional region, and being formed as a metal strip that surrounds and is spaced apart from said functional region.

3. The LED device as claimed in claim 2, wherein said first bonding layer includes a first portion that is located on said second metal layer, and a second portion that is located on said substrate and at a side of said second metal layer distal from said first metal layer.

4. The LED device as claimed in claim 3, wherein, in said thickness direction, said first portion of said first bonding layer has a thickness ranging from 35 μm to 50 μm, and said second portion of said first bonding layer has a thickness ranging from 50 μm to 150 μm.

5. The LED device as claimed in claim 1, wherein said substrate has a cup structure, said functional region being formed inside said cup structure, said LED chip being located inside said cup structure.

6. The LED device as claimed in claim 5, wherein said substrate includes a bottom portion and a surrounding portion connected to and extending upwardly from said bottom portion so as to form a receiving space, an upper surface of said bottom portion having said functional region.

7. The LED device as claimed in claim 6, wherein said first bonding layer and said second bonding layer are disposed on an upper surface of said surrounding portion.

8. The LED device as claimed in claim 7, wherein an outer wall of said surrounding portion is formed with an indented platform, and said bonding layer further includes a third bonding layer disposed on said indented platform and connected to said first bonding layer and said second bonding layer.

9. The LED device as claimed in claim 8, wherein said first bonding layer is arranged to be perpendicular to each of said second bonding layer and said third bonding layer, and said first bonding layer, said second bonding layer and said third bonding layer cooperatively form a continuous structure that has a T shape.

10. The LED device as claimed in claim 1, wherein said bonding layer has a thickness ranging from 35 μm to 150 μm in said thickness direction.

11. The LED device as claimed in claim 1, wherein said light-transmissive element is made of quartz glass.

12. The LED device as claimed in claim 1, wherein a distance between a geometry center of said light-transmissive element and a geometry center of said LED chip is smaller than 100 μm.

13. The LED device as claimed in claim 1, wherein said bonding layer includes a sidewall that is aligned with a sidewall of said substrate in said thickness direction.

14. The LED device as claimed in claim 1, wherein said bonding layer further includes a third bonding layer disposed on at least a part of a sidewall of said substrate.

15. The LED device as claimed in claim 14, wherein said bonding layer further includes a fourth bonding layer disposed on a part of an upper surface of said light-transmissive element.

16. The LED device as claimed in claim 1, wherein said bonding layer further includes a third bonding layer disposed on a sidewall of said substrate, said sidewall of said light-transmissive element being aligned with said sidewall of said substrate in said thickness direction.

17. The LED device as claimed in claim 1, wherein said sidewall of each of said first bonding layer and said light-transmissive element extends in said thickness direction.

18. The LED device as claimed in claim 1, wherein said first bonding layer is arranged to be transverse to said second bonding layer.

19. The LED device as claimed in claim 1, wherein said first bonding layer is arranged to be perpendicular to said second bonding layer, and said first bonding layer and said second bonding layer cooperatively form a continuous structure that has an L shape.

20. The LED device as claimed in claim 1, wherein said light-transmissive element has a plate structure.

* * * * *